United States Patent
Masuda et al.

(10) Patent No.: US 11,672,059 B2
(45) Date of Patent: Jun. 6, 2023

(54) LIGHT SOURCE DEVICE AND ELECTRONIC DEVICE

(71) Applicant: SONY SEMICONDUCTOR SOLUTIONS CORPORATION, Kanagawa (JP)

(72) Inventors: Takashi Masuda, Kanagawa (JP); Mitsushi Tabata, Kanagawa (JP); Koichi Okamoto, Kanagawa (JP); Yasuo Oba, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/310,313

(22) PCT Filed: Jan. 16, 2020

(86) PCT No.: PCT/JP2020/001168
§ 371 (c)(1),
(2) Date: Jul. 27, 2021

(87) PCT Pub. No.: WO2020/162128
PCT Pub. Date: Aug. 13, 2020

(65) Prior Publication Data
US 2022/0104322 A1 Mar. 31, 2022

(30) Foreign Application Priority Data
Feb. 5, 2019 (JP) .............................. JP2019-019194

(51) Int. Cl.
*H05B 45/30* (2020.01)
*H05B 45/325* (2020.01)
(Continued)

(52) U.S. Cl.
CPC ............ *H05B 45/325* (2020.01); *G01S 7/484* (2013.01); *G05F 1/56* (2013.01); *H05B 45/30* (2020.01); *H05B 47/25* (2020.01)

(58) Field of Classification Search
CPC ...... H05B 45/30; H05B 45/32; H05B 45/325; H05B 45/34; H05B 45/345; H05B 45/395;
(Continued)

(56) References Cited

U.S. PATENT DOCUMENTS 8,804,784 B2 * 8/2014 Kamatani .......... G06K 15/1209
372/38.07
2007/0171947 A1 7/2007 Bell
(Continued)

FOREIGN PATENT DOCUMENTS

CA       2770058 A1    2/2011
CN     101861008 A    10/2010
(Continued)

OTHER PUBLICATIONS

International Search Report and Written Opinion of PCT Application No. PCT/JP2020/001168, dated Mar. 31, 2020, 10 pages of ISRWO.

*Primary Examiner* — Long Nguyen
(74) *Attorney, Agent, or Firm* — Chip Law Group

(57) ABSTRACT

A light source device that includes a first resistor that is connected to a given potential, a light emitting element that is connected in series to the first resistor, a second resistor that is connected to the given potential, and a first current source that is connected in series to the second resistor and that is configured to supply a freely-selected current within a given range are included. A first voltage is taken out from a first connection part where the first resistor and the light emitting element are connected to each other and a second voltage is taken out from a second connection part where the
(Continued)

second resistor and the first current source are connected to each other.

21 Claims, 17 Drawing Sheets

(51) Int. Cl.
*H05B 47/25* (2020.01)
*G01S 7/484* (2006.01)
*G05F 1/56* (2006.01)

(58) Field of Classification Search
CPC ...... H05B 45/397; H05B 45/40; H05B 45/50; H05B 47/25; G05F 1/56; H03K 17/0822; H03K 2217/0027; H01S 6/0239; H01S 5/4025; H01S 5/4028; H01S 5/06808; H01S 5/06825; G01S 7/484
See application file for complete search history.

(56) References Cited

U.S. PATENT DOCUMENTS

| | | |
|---|---|---|
| 2010/0244801 A1 | 9/2010 | Arora et al. |
| 2010/0295476 A1 | 11/2010 | Franco |
| 2012/0134378 A1 | 5/2012 | Kamatani |
| 2013/0320881 A1 | 12/2013 | Cozzolino et al. |
| 2022/0094139 A1* | 3/2022 | Masuda ............. H03K 17/0812 |

FOREIGN PATENT DOCUMENTS

| | | |
|---|---|---|
| CN | 102549857 A | 7/2012 |
| CN | 103455073 A | 12/2013 |
| EP | 2230579 A1 | 9/2010 |
| EP | 2234255 A1 | 9/2010 |
| GB | 2469370 A | 10/2010 |
| JP | 2-275684 A | 11/1990 |
| JP | 5-259544 A | 10/1993 |
| JP | 2001-016082 A | 1/2001 |
| JP | 2003-092453 A | 3/2003 |
| JP | 2003-289172 A | 10/2003 |
| JP | 2005-032798 A | 2/2005 |
| JP | 2010-074379 A | 4/2010 |
| JP | 2011-044604 A | 3/2011 |
| JP | 2013-066085 A | 4/2013 |
| KR | 10-2012-0025616 A | 3/2012 |
| KR | 10-2013-0135163 A | 12/2013 |
| WO | 2011/021469 A1 | 2/2011 |

* cited by examiner

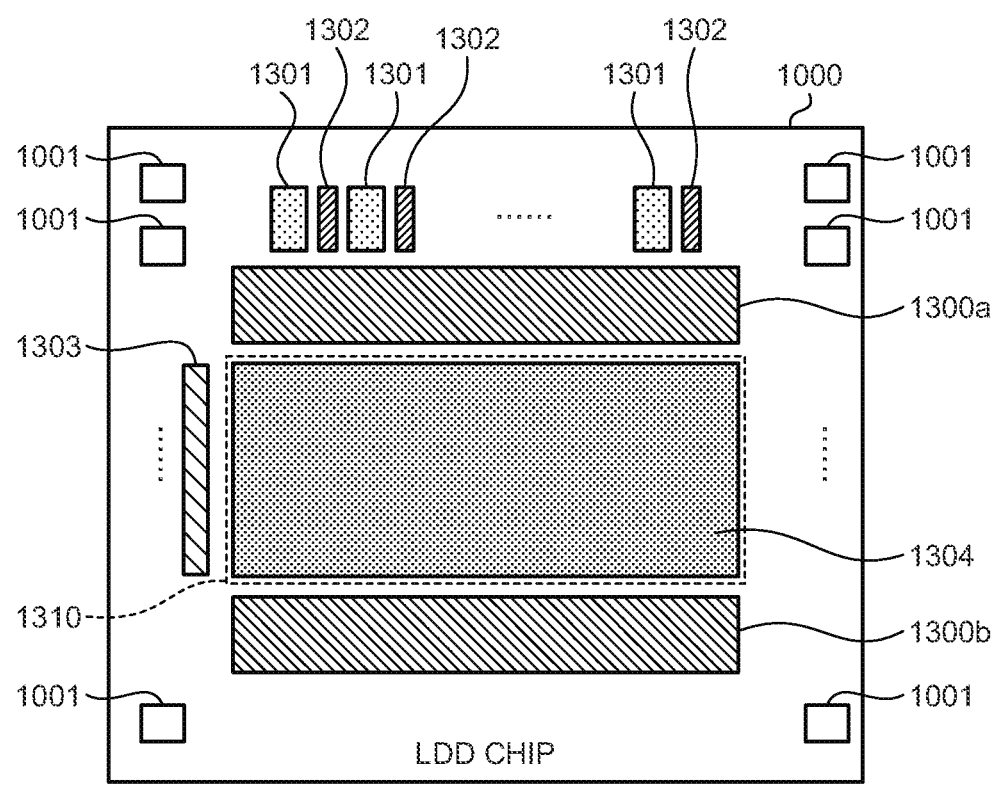

LIGHT SOURCE DEVICE AND ELECTRONIC DEVICE

CROSS REFERENCE TO RELATED APPLICATIONS

This application is a U.S. National Phase of International Patent Application No. PCT/JP2020/001168 filed on Jan. 16, 2020, which claims priority benefit of Japanese Patent Application No. JP 2019-019194 filed in the Japan Patent Office on Feb. 5, 2019. Each of the above-referenced applications is hereby incorporated herein by reference in its entirety.

FIELD

The present invention relates to a light source device and an electronic device.

BACKGROUND

Light emitting elements that emit light according to a current, such as laser diodes, are known. When a current far surpassing a designed value (overcurrent) flows into such a light emitting element due to, for example, a failure in a power supply system, there is a risk of causing emission of an unexpected large amount of light or, depending on the circumstance, a break of the light emitting element itself. Thus, techniques to monitor a current flown into a light emitting element have been proposed.

CITATION LIST

Patent Literature

Patent Literature 1: Japanese Laid-open Patent Publication No. 2001-016082
Patent Literature 2: Japanese Laid-open Patent Publication No. 2013-066085

SUMMARY

Technical Problem

As one of methods of monitoring a current that flows into a light emitting element, there is a method in which a detection resistor is inserted into a path via which a current is supplied to the light emitting element and a voltage between both ends of the detection resistor is measured. In the method in which a detection resistor is inserted into a current path, however, when the detection resistor is implemented by a resistor in a chip, because the resistance of the resistor in the chip varies widely, a problem may occur in accuracy of the monitoring result.

There is a method in which a current (replica) that is supplied from the same power supply as that of a light emitting element is monitored and thus it is considered that a current that flows into the light emitting element is monitored. This method however has a possibility that a defect in the current flowing into the light emitting element cannot be detected.

An object of the disclosure is to provide a light source device and an electronic device capable of more accurately detecting a current that is supplied to a light emitting element.

Solution to Problem

For solving the problem described above, a light source device according to one aspect of the present disclosure has a first resistor that is connected to a given potential; a light emitting element that is connected in series to the first resistor; a second resistor that is connected to the given potential; and a first current source that is connected in series to the second resistor and that is configured to supply a freely-selected current within a given range, wherein a first voltage is taken out from a first connection part where the first resistor and the light emitting element are connected to each other and a second voltage is taken out from a second connection part where the second resistor and the first current source are connected to each other.

BRIEF DESCRIPTION OF DRAWINGS

FIG. 15C is a diagram for explaining an example in the case where a capacitor is further arranged on the LDD chip according to the fourth embodiment.

DESCRIPTION OF EMBODIMENTS

Each embodiment of the disclosure will be described in detail below based on the drawings. In each embodiment below, the same components are denoted with the same reference number and thus redundant description is omitted.

Configuration Common Among Embodiments

Figure 1:
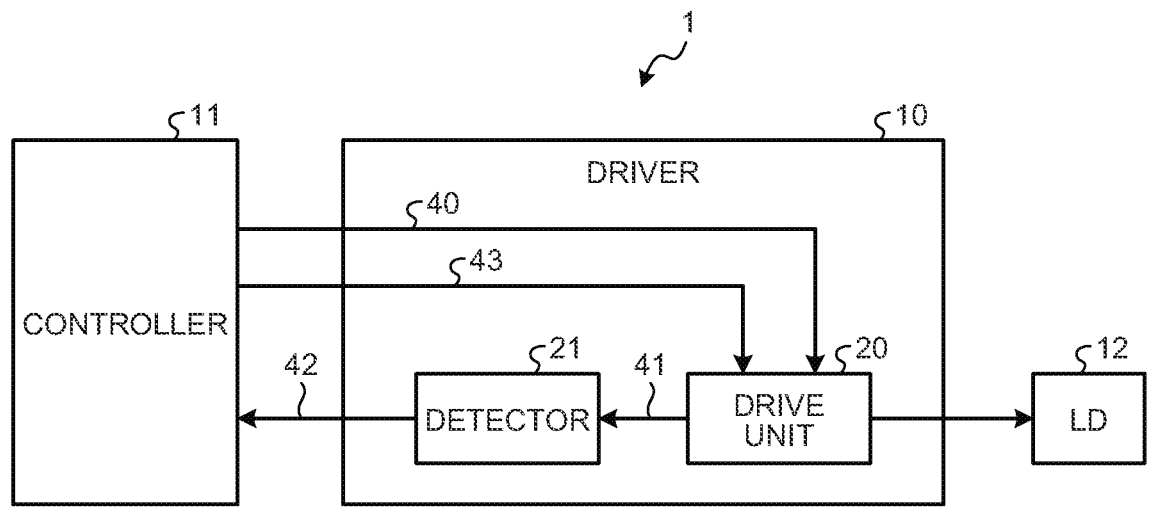
FIG. 1 is a block diagram illustrating a configuration of an example of a light source device that is applicable to each embodiment.

The disclosure relates to control on a light emitting element that emits light according to a current, such as a laser diode. FIG. 1 is a block diagram illustrating a configuration of an example of a light source device that is applicable to each embodiment.

The light emitting device is described as a laser diode (LD) below. Using characteristics in excellence in linearity of light in traveling and light focusing, a fast response speed and a low power consumption, laser diodes are used in various fields, such as distance measurement, light transmission and electrophotographic printers. Light emitting elements applicable to the disclosure are not limited to laser diodes. For example, an LED (Light Emitting Diode) is applicable as a light emitting element.

In FIG. 1, a light source device 1 includes a driver 10 and a laser diode 12. A controller 11 may be included in the light source device 1. The driver 10 drives the laser diode 12 and causes the laser diode 12 to emit light according to control of the controller 11. The controller 11 includes, for example, a CPU (Central Processing Unit) and a memory, supplies a control signal 40 that is generated according to a program that is previously stored in a memory by the CPU to the driver 10, and controls the driver 10. Based on a detection signal 42 that is output from the driver 10, the controller 11 determines whether an overcurrent is supplied to the laser diode 12. When it is determined that an overcurrent is supplied to the laser diode 12, the controller 11 generates a control signal 43 indicating the fact and supplies the control signal 43 to the driver 10.

Assume that the overcurrent is a current that is larger than a current for causing the laser diode 12 to emit a given amount of light and the difference between the currents is at or above a threshold.

The driver 10 includes a drive unit 20 and a detector 21. The drive unit 20 generates a drive current for causing the laser diode 12 to emit light according to the control signal 40 that is supplied from the controller 11 and supplies the generated drive current to the laser diode 12. The drive unit 20 is able to control on/off of light emission by the laser diode 12 according to the control signal 43 that is supplied from the controller 11. The drive unit 20 supplies a signal 41 indicating a current value of the drive current that drives the laser diode 12 to the detector 21. The detector 21 supplies the detection signal 42 based on the signal 41 that is supplied from the drive unit 20 to the controller 11.

Determination on whether an overcurrent is supplied to the laser diode 12 may be made by the detector 21. For example, the detector 21 determines whether an overcurrent is supplied to the laser diode 12 based on the signal 41 that is supplied from the drive unit 20. As a result, when it is determined that an overcurrent is supplied to the laser diode 12, the detector 21 supplies a signal indicating the fact to the drive unit 20. According to the signal, the drive unit 20, for example, stops the laser diode 12 from emitting light. In this manner, by supplying the signal indicating that an overcurrent is supplied to the laser diode 12 from the detector 21 directly to the drive unit 20, it is possible to increase the speed of response.

Example of Configuration According to Existing Technique

Figure 2:
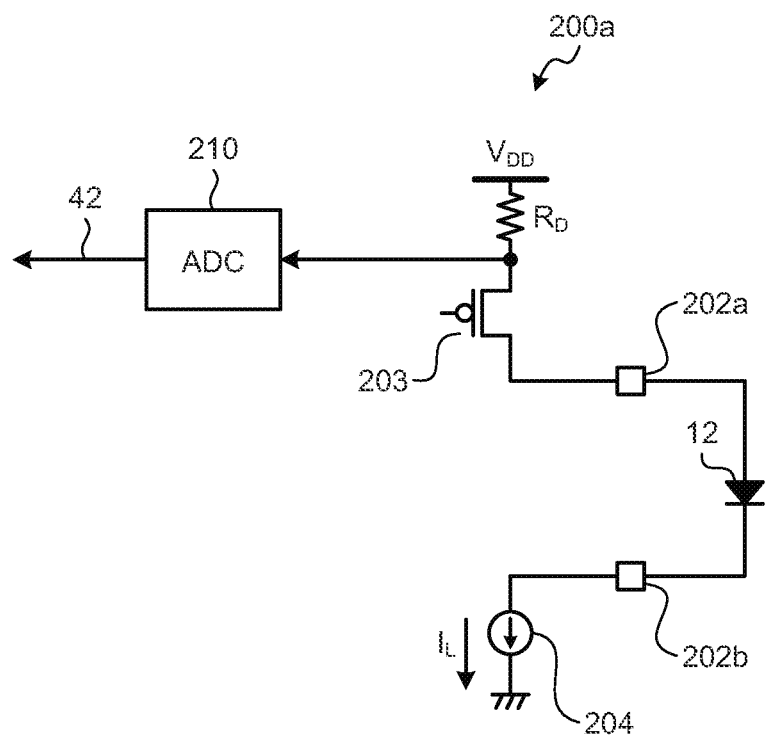
FIG. 2 is a diagram for explaining an example of a configuration for detecting a drive current to a laser diode according to an existing technique.
Figure 3:
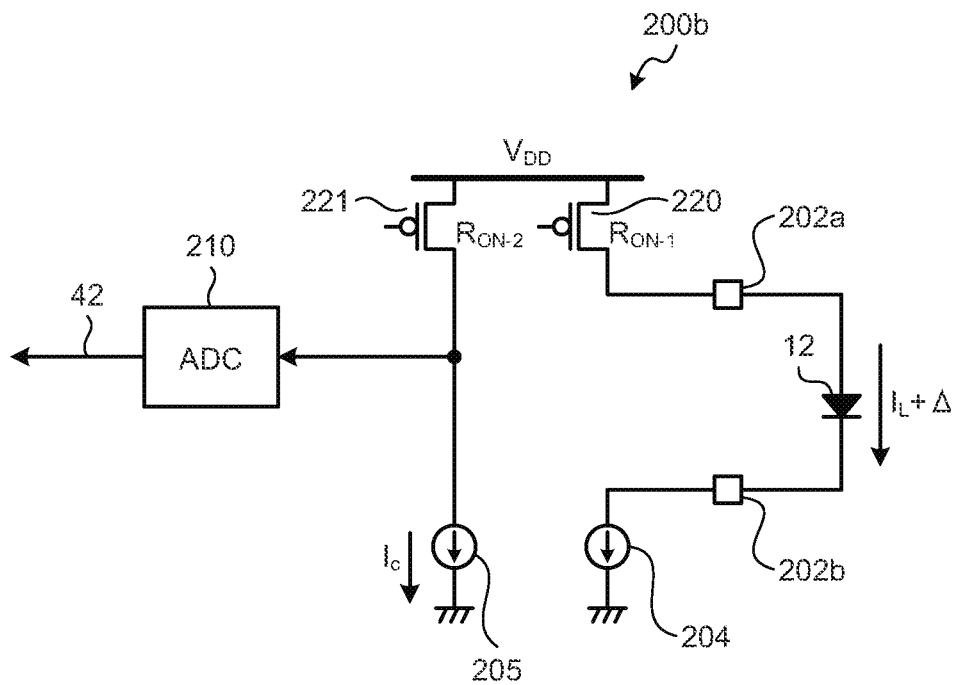
FIG. 3 is a diagram for explaining an example of a configuration for detecting a drive current to a laser diode according to an existing technique.

Prior to description of the disclosure, an example of a configuration for detecting a drive current to the laser diode 12 according to an existing technique will be described using FIGS. 2 and 3. FIG. 2 is a diagram illustrating a configuration of an example of a driver according to the existing technique. In FIGS. 2 and 3, each of drivers 200a and 200b corresponds to the driver 10 in FIG. 1 described above. An ADC (Analog to Digital Converter) 210 corresponds to the detector 21 in the driver 10 in FIG. 1.

The driver 200a includes a resistor $R_D$, a transistor 203 that is a P-channel MOS (Metal-Oxide Semiconductor) transistor, and a current source 204 that supplies a current $I_L$. The current $I_L$ is, for example, a current for causing the laser diode 12 to emit a given amount of light.

In FIG. 2, one end of the resistor $R_D$ is connected to the power supply of a voltage $V_{DD}$. The other end of the resistor $R_D$ is connected to the anode of the laser diode 12 via the drain and source of the transistor 203 and a joint 202a. The cathode of the laser diode 12 is connected to the current source 204 via a joint 202b.

For example, by controlling operations of the current source 204 with a drive circuit that is included in the drive unit 20 and is not illustrated the drawing, it is possible to control light emission by the laser diode 12. For example, by controlling the current source 204 by a square wave of a given duty, it is possible to cause the laser diode 12 to emit an amount of light corresponding to the duty.

The joints 202a and 202b are arranged to, when the laser diode 12 and the driver 200a are configured separately, connect the laser diode 12 and the driver 200a to each other.

In the configuration, a voltage is taken out at a point of connection where the resistor $R_D$ and the transistor 203 are connected to each other and is supplied to the ADC 210. The ADC 210 converts the voltage value of the supplied voltage into a digital signal and supplies the digital signal as the detection signal 42 to the controller 11. Based on the detection signal 42, the controller 11 determines whether an overcurrent is supplied to the laser diode 12 and, when it is determined that an overcurrent is supplied, for example, outputs the control signal 43 for controlling on/off of light emission by the laser diode 12. The control signal 43 is input to the gate of the transistor 203 of the driver 200a and controls on (close)/off (open) of the transistor 203. For example, when the detection signal 42 indicates that a current $I_L+\Delta$ exceeding a threshold to determine normal drive is supplied to the laser diode 12, the controller 11 determines that an overcurrent is supplied to the laser diode 12.

In the configuration illustrated in FIG. 2 in which the resistor $R_D$ is inserted in series into the path through which a current is supplied to the laser diode 12, when the resistor $R_D$ is implemented by a resistor in a chip, the resistor in a chip has a risk of insufficient accuracy in variance of approximately ±20% in resistance value, or the like. Depending on the application using the laser diode 12, for example, a current of an amperes order may be supplied to the laser diode 12. In this case, a voltage drop that occurs in the resistor $R_D$ cannot be ignored.

FIG. 3 is a diagram illustrating another configuration of a driver according to an existing technique. In FIG. 3, a driver 200b uses a duplicated path (replica path) of a path (main line) through which a current $I_L$ to flow into the laser diode 12 is supplied and regards the current on the replica path as a current to flow into the laser diode 12.

The driver 200b includes transistors 220 and 221 each of which is a P-channel MOS transistor, the current source 204 that supplies a current $I_L$, a current source 205 that supplies a current $I_c$, and the ADC 210. Assume that on-resistances $R_{ON-1}$ and $R_{ON-2}$ of the respective transistors 220 and 221 are substantially the same.

The sources of the transistors 220 and 221 are connected to a common power supply of a voltage $V_{DD}$. The drain of the transistor 220 is connected to the anode of the laser diode 12 via the joint 202a. The cathode of the laser diode 12 is connected to the current source 204 via the joint 202b. On the other hand, the drain of the transistor 221 is connected to the current source 205. A voltage is taken out at a point of connection where the drain of the transistor 221 and the current source 205 are connected to each other and is supplied to the ADC 210.

For example, the detection signal 42 indicates a current $I_L+\Delta$ greater than the current $I_L$ by a given amount or more, it can be considered that an overcurrent is supplied to the laser diode 12.

The configuration in FIG. 3 has a possibility that a failure in the main line, that is, the path through which a current is supplied to the laser diode 12 cannot be detected. On the other hand, while the above-described configuration exemplified in FIG. 2 makes it possible to directly measure the current on the main line, it is not suitable to fine processing when the resistor $R_D$ is implemented by a resistor in a chip. In other words, a bipolar transistor or a 0.25-µm process was used in the past; however, in recent years, for example, there is an advance in fine processing for the purpose of realizing complicated control in sensing use and in decrease in voltage associated with the fine processing, which causes a need for designing a circuit under a withstand voltage restriction. While detection accuracy can be increased as the voltage drop occurring in the resistor $R_D$ increases, a high voltage $V_{DD}$ is required as the voltage drop increases and thus the configuration exemplified in FIG. 2 would not be along the tendency.

First Embodiment

A first embodiment of the disclosure will be described next. In the first embodiment, a voltage of the replica that is described using FIG. 3 is measured and a voltage is measured also on the main line on which the laser diode 12 is arranged. Based on each of the measured voltages on the replica path and the main line and a known current $I_C$ caused by the current source arranged on the replica, a current $I_L+\Delta$ that is supplied to the laser diode 12 is estimated.

Figure 4:
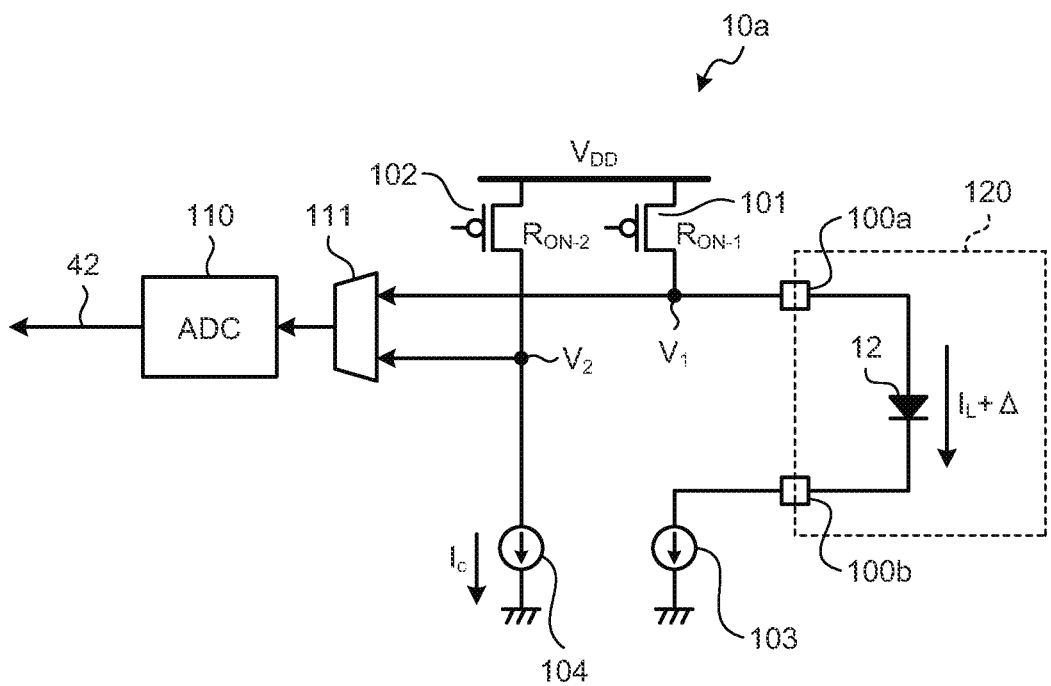
FIG. 4 is a diagram illustrating a configuration of an example of a driver according to a first embodiment.

FIG. 4 is a diagram illustrating a configuration of an example of a driver according to the first embodiment. In FIG. 4, a driver 10a includes transistors 101 and 102 each of which is a P-channel MOS transistor, a current source 103 that supplies a current $I_L$, and a current source 104 that supplies a current $I_c$. An ADC 110 and a selector 111 may be further included in the driver 10a.

In FIG. 4, joints 100a and 100b are arranged to, when the laser diode 12 and the driver 10a are configured separately, connect the laser diode 12 and the driver 10a to each other. For example, the driver 10a is configured on a single semiconductor chip and the laser diode 12 is configured as a unit 120 different from the semiconductor ship. The laser diode 12 and the driver 10a are electrically connected by the joints 100a and 100b.

The transistors 101 and 102 are configured such that on-resistances ($R_{ON-1}$ and $R_{ON-2}$) are approximately equal to each other. For example, the transistors 101 and 102 are formed in sizes approximately the same. Furthermore, the transistors 101 and 102 are preferably arranged in positions that are close to each other thermally.

Each of the sources of the transistors 101 and 102 is connected to a common power supply of a voltage $V_{DD}$. The drain of the transistor 101 is connected to the anode of the laser diode 12 via the joint 100a. The cathode of the laser diode 12 is connected to the current source 103 via the joint 100b. On the other hand, the drain of the transistor 102 is connected to the current source 104. A voltage $V_1$ is taken out at a point of connection where the source of the transistor 101 and the anode of the laser diode 12 are connected to each other and is supplied to the ADC 110. A voltage $V_2$ is taken out at a point of connection where the drain of the transistor 102 and the current source 104 are connected to each other and is supplied to the ADC 110.

The selector 111 sequentially switches between the voltages $V_1$ and $V_2$ and inputs the voltages $V_1$ and $V_2$ to the ADC 110. The ADC 110 converts the voltage values of the respective input voltages $V_1$ and $V_2$ into voltages $V_1$ and $V_2$ serving as digital signals and supplies the voltages $V_1$ and $V_2$ to the controller 11. Based on the voltages $V_1$ and $V_2$, the voltage $V_{DD}$ of the power supply, and the current $I_c$, the controller 11 determines whether an overcurrent is supplied to the laser diode 12.

More specific description will be given. Assume that the resistance values of an on-resistance $R_{ON-1}$ of the transistor 101 and an on-resistance $R_{ON-2}$ of the transistor 102 are approximately equal to each other and are unknown. Assume that the current value of the current $I_c$ that the current source 104 supplies is known.

In such a configuration, the on-resistance $R_{ON-2}$ is calculated from the voltage $V_2$ and the current $I_c$ by Equations (1) and (2) below.

$$V_2 = V_{DD} - I_c \times R_{ON-2} \tag{1}$$

$$R_{ON-2} = (V_{DD} - V_2)/I_c \tag{2}$$

The voltage $V_1$ is calculated by Equation (3). From Equation (3), a current ($I_L + \Delta$) is calculated by Equation (4).

$$V_1 = V_{DD} - (I_L + \Delta) \times R_{ON\text{-}1} \quad (3)$$

$$I_L + \Delta = (V_{DD} - V_1)/R_{ON\text{-}1} \quad (4)$$

When the on-resistance $R_{ON\text{-}1}$ and the on-resistance $R_{ON\text{-}2}$ are approximately equal to each other, from Equations (2) and (4), the current ($I_L + \Delta$) that is supplied to the laser diode 12 is expressed by Equation (5) below.

$$I_L + \Delta = \{(V_{DD} - V_1)/(V_{DD} - V_2)\} \times I_c \quad (5)$$

The controller 11 calculates, in Equation (5), a current $\Delta$ that is a difference between the current $I_L + \Delta$ that is calculated based on the voltage $V_{DD}$, the voltages $V_1$ and $V_2$, and the current $I_c$ and the known current $I_L$. Based on the current $\Delta$ of the difference, the controller 11 determines whether an overcurrent is supplied to the laser diode 12. For example, when the current $\Delta$ of the difference is at or above a threshold, the controller 11 determines that an overcurrent is supplied to the laser diode 12.

According to Equation (5), it is represented that the current value of the current $I_c$ is not particularly limited as long as the current value is a known value. Practically, any value within a range enabling the transistor 102 to operate normally and enabling detection of the voltage $V_2$ at a given accuracy is preferably selected.

When it is determined that an overcurrent is supplied to the laser diode 12, for example, the controller 11 outputs the control signal 43 indicating the fact. The control signal 43 is, for example, input to the gates of the transistors 101 and 102 and controls the transistors 101 and 102 at an off state. Alternatively, the controller 11 is able to control at least the transistor 101 of the transistors 101 and 102 at an off state.

As a cause of supply of an overcurrent to the laser diode 12, there would be various causes, such as a failure in the current source 103, a failure in the power supply that supplies the voltage $V_{DD}$, and a failure in connection in the joints 100a and 100b.

For example, assume that the light source device 1 according to the disclosure is applied to a ranging device that measures a distance by receiving reflection light that is light emitted by the laser diode 12 and reflected off an object. In this case, when laser light that is more intense than assumed is emitted from the laser diode 12 because of an overcurrent, there is a risk that, when the laser light is applied to the face, the laser light may affect the eyes. Furthermore, an overcurrent may break the element of the laser diode 12 itself.

Applying the light source device 1 according to the first embodiment makes it possible to detect an overcurrent to the laser diode 12 more accurately. Thus, applying the light source device 1 according to the first embodiment makes it possible to reduce supply of an overcurrent to the laser diode 12 and prevent an effect on the eyes in the case where the light source device 1 is applied to a ranging device and break of the laser diode 12 itself.

In FIG. 4, in the path of the main line in which the laser diode 12 is contained, when viewed from the side of supply of power of the voltage $V_{DD}$, the transistor 101, the laser diode 12, and the current source 103 are connected in this order; however, the connection is not limited to this example.

Figure 5A:
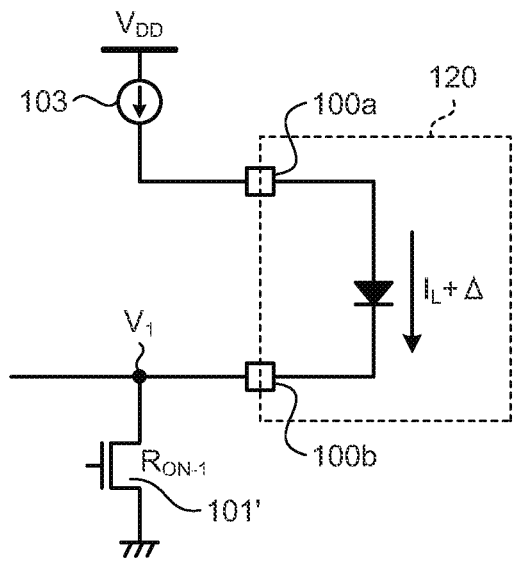
FIG. 5A is a diagram illustrating another example of connection of a path of a main line, which is applicable to the first embodiment.
Figure 5B:
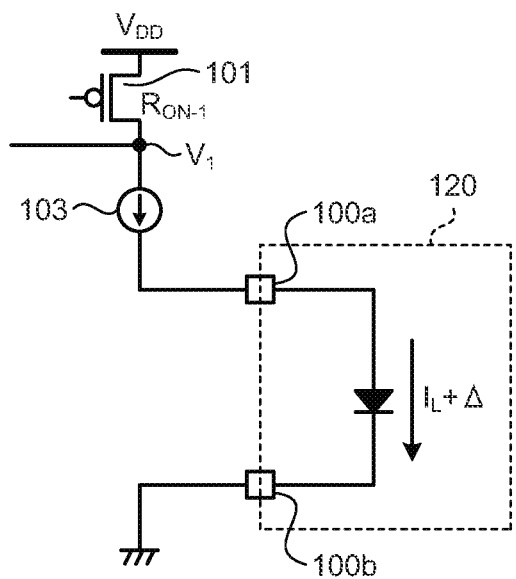
FIG. 5B is a diagram illustrating another example of connection of a path of a main line, which is applicable to the first embodiment.

FIGS. 5A and 5B are diagrams illustrating another example of connection on the path of the main line that is applicable to the first embodiment. For example, as illustrated in FIG. 5A, when viewed from the side of supply of power of the voltage $V_{DD}$, the current source 103, the laser diode 12, and a transistor 101' can be connected in this order. The transistor 101' is an N-channel MOS transistor. In this case, the voltage $V_1$ can be taken out from a point of connection where the laser diode 12 and the transistor 101' are connected to each other. On the replica side, when viewed from the side of supply of the power of the voltage $V_{DD}$, the current source 104 and the transistor that is an N-channel MOS transistor would be connected in this order and the voltage $V_2$ would be taken out from a point of connection where the current source 104 and the transistor are connected to each other.

For example, as illustrated in FIG. 5B, when viewed from the side of supply of power of the voltage $V_{DD}$, the transistor 101, the current source 103, the laser diode 12 can be connected in this order. In this case, the voltage $V_1$ can be taken out from a point of connection where the transistor 101 and the current source 103 are connected to each other. On the replica side, it is assumable that, when viewed from the side of supply of power of the voltage $V_{DD}$, the transistor 102, the current source 104 are connected in this order and the voltage $V_2$ is taken out from a point of connection where the current source 104 and the transistor 102 are connected to each other.

Modification of First Embodiment

Figure 6:
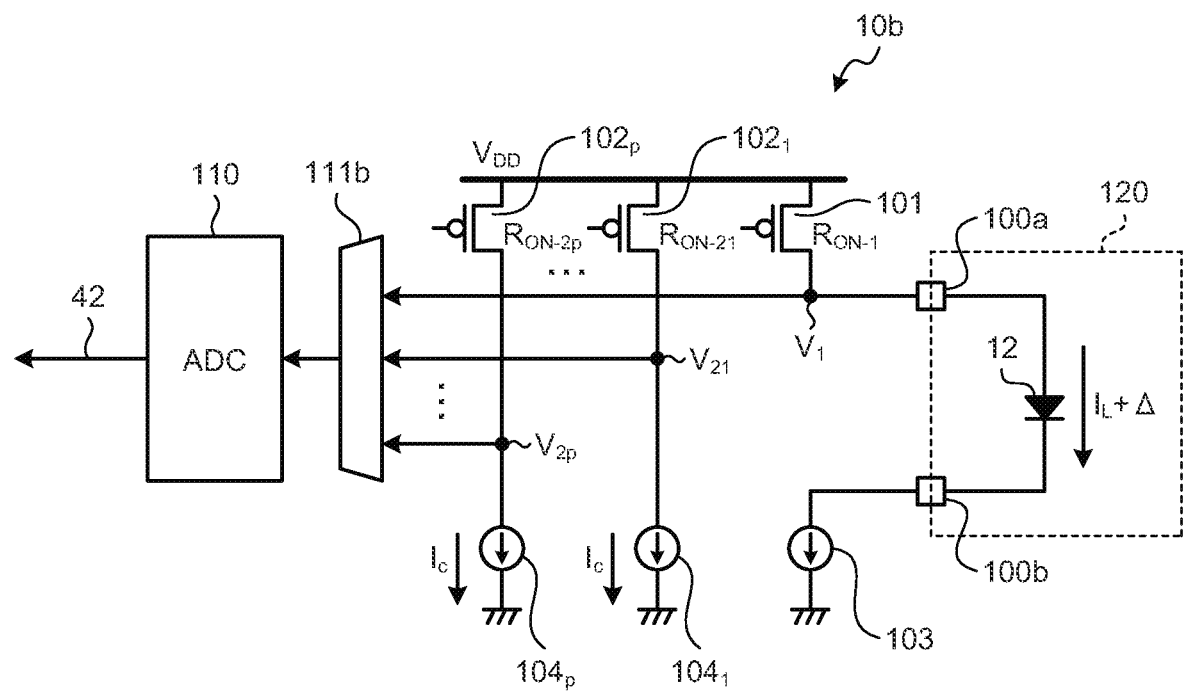
FIG. 6 is a diagram illustrating a configuration of an example of a driver according to a modification of the first embodiment.

A modification of the first embodiment will be described next. FIG. 6 is a diagram illustrating a configuration of an example of a driver according to the modification of the embodiment. In FIG. 6, a driver 10b has a plurality of replica paths. The controller 11 determines whether each of voltages that are taken out of the respective replica paths is within a given range and does not trust a replica path of which a voltage out of the given range is taken out.

In FIG. 6, the transistor 101 of the main line is connected to a power supply of a voltage $V_{DD}$ and transistors $102_1, \ldots,$ and $102_p$ of the replica paths are connected to the power supply of the voltage $V_{DD}$. On the replica paths, the transistors $102_1, \ldots, 102_p$ have on-resistances $R_{ON\text{-}21}, \ldots, R_{ON\text{-}2p}$, respectively, and the drains of the transistors $102_1, \ldots, 102_p$ have one-on-one connections to current sources $104_1, \ldots, 104_p$ each of which supplies a current $I_C$. On the respective replica paths, voltages $V_{21}, \ldots, V_{2p}$ are taken out from respective points of connection where the transistors $102_1, \ldots, 102_p$ and the current sources $104_1, \ldots, 104_p$ have one-on-one connections and each of the voltages $V_{21}, \ldots, V_{2p}$ is supplied to the ADC 110.

The ADC 110 sequentially selects the voltages $V_1$, $V_{21}, \ldots, V_{2p}$ using a selector 111b converts the voltages $V_1$, $V_{21}, \ldots, V_{2p}$ into digital signals and supplies each of the digital signals as the detection signal 42 to the controller 11.

The controller 11 determines whether each of the voltages $V_{21}, \ldots, V_{2p}$ that are taken out of the respective replica paths is within the given voltage range. The controller 11, for example, turns off a replica path of which a voltage determined as one out of the given voltage range among the voltages $V_{21}, \ldots, V_{2p}$ is taken out. As a more specific example, when it is determined that the voltage $V_{2p}$ is a voltage out of the given voltage range, the controller 11 fixedly inputs a signal to turn the corresponding transistor $102_p$ off to the gate of the transistor $102_p$.

According to the modification of the first embodiment, the driver 10b includes the replica paths and, based on the voltages $V_{21}, \ldots, V_{2p}$ that are taken out of the respective replica paths, selects a reliable value among the voltages $V_{21}, \ldots, V_{2p}$. Thus, the driver 10 according to the modification of the first embodiment is able to increase reliability in detecting an overcurrent to the laser diode 12.

Second Embodiment

A second embodiment will be described next. In the second embodiment, level shift to low voltages is performed on voltages that are taken out of a replica path and a main line and the low voltages are supplied to the ADC 110.

Figure 7:
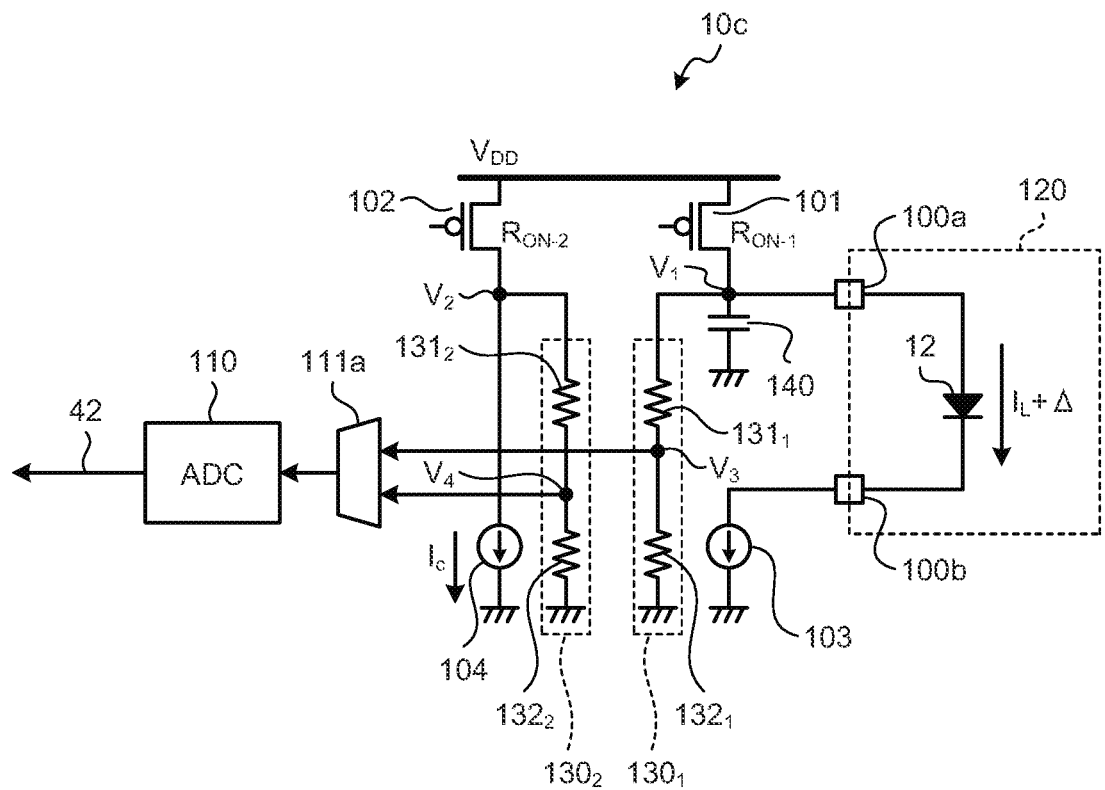
FIG. 7 is a diagram illustrating a configuration of an example of a driver according to a second embodiment.

FIG. 7 is a diagram illustrating a configuration of an example of a driver according to the second embodiment. A driver 10c according to the second embodiment in FIG. 7 is obtained by adding level shifters $130_1$ and $130_2$ that change the voltages of voltages $V_1$ and $V_2$, respectively, to the configuration of the driver 10a described using FIG. 4.

The level shifter $130_1$ includes resistors $131_1$ and $132_1$ and steps down the voltage $V_1$ by resistive voltage division by the resistors $131_1$ and $132_1$, thereby generating a voltage $V_3$. Similarly, the level shifter $130_2$ includes resistors $131_2$ and $132_2$ and steps down a voltage $V_2$ by resistive voltage division by the resistors $131_2$ and $132_2$, thereby generating a voltage $V_4$. The voltages $V_3$ and $V_4$ that are generated by stepping down the voltages $V_1$ and $V_2$ by the level shifters $130_1$ and $130_2$ are supplied as the voltages $V_1$ and $V_2$ to a selector 111a.

As described above, in the second embodiment, the voltages $V_3$ and $V_4$ obtained by performing level shift to low voltages by stepping down the voltages $V_1$ and $V_2$ are supplied to the ADC 110. Thus, for example, when the gate withstand voltage of the transistor that is used for input of the ADC 110 is low because of fine processing, it is possible to protect the input circuit of the ADC 110.

In other words, a forward voltage Vf of the laser diode 12 is large and, because of limitation on the head room in the input circuit of the ADC 110, the voltage of the power supplied to the laser diode 12 (in other words, the voltage $V_1$) may exceed the withstand voltage of the gate oxide film of the MOS transistor that is used for the input unit of the ADC 110. In the driver 10c according to the second embodiment, level shift to a low voltage is performed on the voltage $V_1$ using a level shifter and the low voltage is input to the ADC 110. This enables protection of the input circuit of the ADC 110.

In the example in FIG. 7, a capacitor 140 that is connected between the drain of the transistor 101 and a ground potential is further added. The capacitor 140 stores a charge corresponding to the voltage $V_{DD}$ of the power supply that is supplied via the transistor 101. For example, when current supply to the laser diode 12 by the current source 103 is performed by PWM drive, a current is supplied to the laser diode 12 using the charge stored in the capacitor 140 and details thereof will be described below.

First Modification of Second Embodiment

A first modification of the second embodiment will be described next. In the above-described second embodiment, the level shifters for the voltages $V_1$ and $V_2$ are configured by resistive voltage division. On the other hand, the first modification of the second embodiment is an example in which the level shifters for the voltages $V_1$ and $V_2$ are configured by source followers and resistors.

Figure 8A:
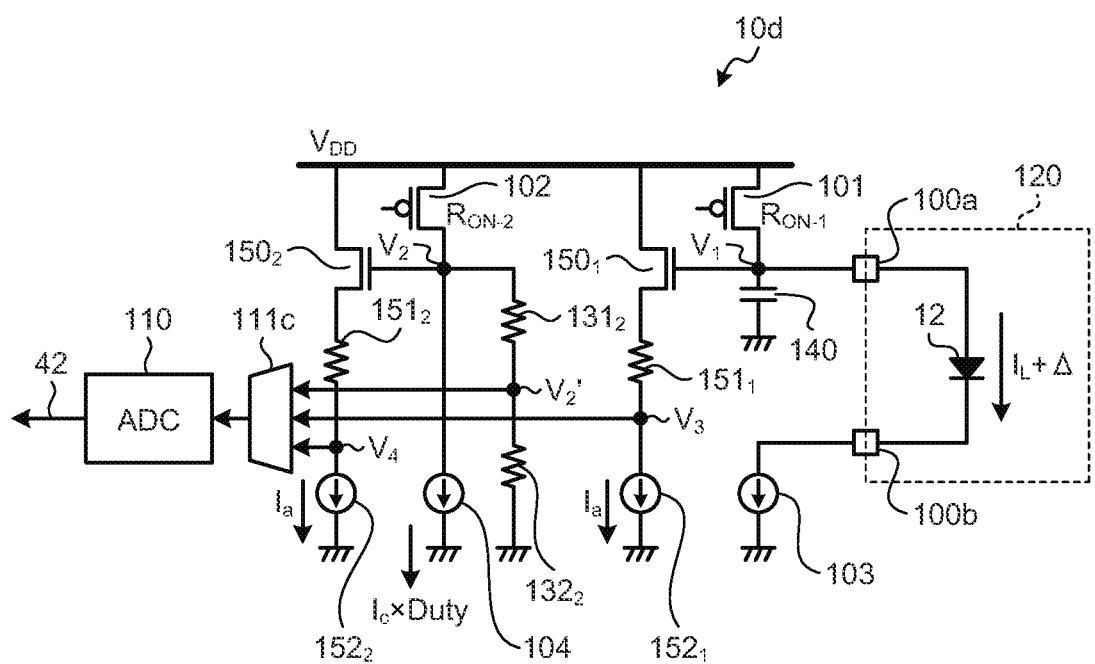
FIG. 8A is a diagram illustrating a configuration of an example of a driver according to a first modification of the second embodiment.
Figure 8B:
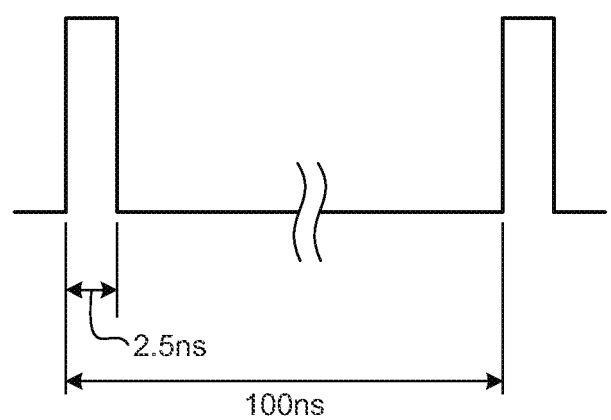
FIG. 8B is a diagram illustrating a configuration of the example of the driver according to the first modification of the second embodiment.

FIGS. 8A and 8B are diagrams illustrating a configuration of an example of a driver according to the first modification of the second embodiment. A driver 10d according to the first modification of the second embodiment in FIG. 8A is obtained by adding a transistor $150_1$, a resistor $151_1$ and a current source $152_1$ and a transistor $150_2$, a resistor $151_2$ and a current source $152_2$ of each of which the level shifters consist to the configuration of the driver 10c described using FIG. 7. In the example in FIG. 8A, each of the transistors $150_1$ and $150_2$ is an N-channel MOS transistor.

In FIG. 8A, in the transistors $150_1$, the gate is connected to a point of connection where the transistor 101 and the laser diode 12 are connected to each other and a voltage $V_1$ is input to the gate, the drain is connected to a power supply of a voltage $V_{DD}$, and the source is connected to one end of the resistor $151_1$. The other end of the resistor $151_1$ is connected to the current source $152_1$ that supplies a current $I_a$. A voltage $V_3$ is taken out from a point of connection where the resistor $151_1$ and the current source $152_1$ are connected to each other and is supplied to a selector 111c.

Similarly, in the transistor $150_2$, the gate is connected to a point of connection where the transistor 102 and the current source 104 are connected to each other and a voltage $V_2$ is input to the gate, the drain is connected to the power supply of the voltage $V_{DD}$, and the source is connected to one end of the resistor $151_2$. The other end of the resistor $151_2$ is connected to the current source $152_2$ that supplies the current $I_a$. A voltage $V_4$ is taken out from a point of connection where the resistor $151_2$ and the current source $152_2$ are connected to each other and is supplied to the selector 111c.

A voltage $V_2'$ obtained by stepping down the voltage $V_2$ by the resistors $131_2$ and $132_2$, which is described above using FIG. 7, is supplied to the selector 111c. The selector 111c, for example, sequentially selects the voltages $V_2'$, $V_3$ and $V_4$ and supplies the voltages $V_2'$, $V_3$ and $V_4$ to the ADC 110. The ADC 110 performs AD conversion on the supplied voltages $V_2'$, $V_3$ and $V_4$ and supplies the result of the AD conversion to the controller 11.

The driver 10d illustrated in FIG. 8A derives the laser diode 12 according to a pulse using a PWM (Pulse Width Modulation) signal. FIG. 8B is a diagram illustrating an example of the PWM signal for driving the laser diode 12. In the example in FIG. 8B, a period from a rise of the signal to the next rise is 100 nsec, a period from a rise to the next fall is 2.5 nsec, and the duty of the high period (referred to as Duty below) is "1/40". In the driver 10d, a drive circuit not illustrated in the drawing performs control on/off of current supply by the current source 103 according to Duty.

A current according to Duty of the PWM signal to the current source 103 is supplied from a supply line of a power supply voltage VDD to the capacitor 140 via the transistor 101. The capacitor 140 is charged with the supplied current. The current that is supplied to the capacitor 140 is equivalent in value to the current of an average current value of a pulse by the PWM signal. For example, when a current $I_L$ is modulated according to given Duty by PWM, the average current value of current per unit time resulting from the pulse according to Duty of the modulated current $I_L$ is calculated as $I_{pls} \times$ Duty. The capacitor 140 is charged with the current of the average current value. When Duty=1/40, the current supplied to the capacitor 140 is $I_L \times (1/40)$.

The charge stored in the capacitor 140 is read by the current source 103 that is driven according to a pulse at a given Duty by the PWM signal and is supplied to the laser diode 12.

On the other hand, the current source 104 on the replica path supplies a current obtained by adding Duty of the PWM signal described above to the current $I_c$ corresponding to the current $I_L$. For example, the current source 104 supplies a current $I_c \times$ Duty obtained by multiplying the current value of the current $I_c$ by Duty.

In such a configuration, the voltages $V_3$ and $V_4$ are calculated by Equations (6) and (7) below. In Equations (6) and (7) below, or the like, "sqrt" denotes a square root of a value in parentheses right after "sqrt".

$$V_1' = V_{DD} - (I_L - \Delta) \times \text{Duty} \times R_{ON\text{-}1} - \{V_{th} + \text{sqrt}(2 \times I_d/\beta)\} - R_1 \times I_a \quad (6)$$

$$V_2' = V_{DD} - I_c \times \text{Duty} \times R_{ON\text{-}2} - \{V_{th} + \text{sqrt}(2 \times I_d/\beta)\} - R_2 \times I_a \quad (7)$$

In the latter terms in Equations (6) and (7), the values $R_1$ and $R_2$ denote resistances of the resistors $151_1$ and $151_2$. "$V_{th}+\text{sqrt}(2\times I_d/\beta)$" denotes a gate-source voltage (voltage $V_{GS}$) of the transistors $150_1$ and $150_2$. The value $V_{th}$ and the value $\beta$ denote a threshold voltage and a gain coefficient of each of the transistors $150_1$ and $150_2$ and are unique to each of the transistors $150_1$ and $150_2$. The transistors $150_1$ and $150_2$ are formed such that the values $V_{th}$ and the values $\beta$ are approximately equal.

The voltage $V_2'$ is calculated by Equation (8) below. In Equation (8), a value k denotes a voltage division ratio by the resistors $131_2$ and $132_2$.

$$V_2' = (V_{DD} - I_c \times \text{Duty} \times R_{ON\text{-}2})/k \quad (8)$$

By Equation (8) above, it is possible to calculate an on resistance $R_{ON\text{-}2} \approx R_{ON\text{-}1}$ when the voltage $V_{DD}$, the current $I_c$, and Duty are known. Using $R_{ON\text{-}2} \approx R_{ON\text{-}1}$, as by Equations (1) to (5) described above, voltages $V_3$ and $V_4$ are calculated by Equations (6) and (7). In Equations (6) and (7), the latter term "$\{V_{th}+\text{sqrt}(2\times I_d/\beta)\} - R_1 \times I_a$" is a term that disappears, for example, when the controller 11 calculates a difference between the voltages $V_3$ and $V_4$.

According to the first modification of the second embodiment, compared to the example of the above-described second embodiment, it is possible to increase the accuracy in the case where level shift is performed. In other words, in the above-described second embodiment, the voltages $V_3$ and $V_4$ that are input to the ADC 110 are obtained by stepping down the voltages $V_1$ and $V_2$ by resistive voltage division. Thus, when the division ratio is 1/2, the difference between the voltages $V_3$ and $V_4$ is 1/2 of that in the case where voltage division is not performed.

On the other hand, in the first modification of the second embodiment, level shift represented by "$\{V_{th}+\text{sqrt}(2\times I_d/\beta)\} - R_1 \times I_a$" of the latter terms in Equations (6) and (7) is performed on each of the main line and the replica path. The term is canceled when the difference between Equations (6) and (7) is calculated and thus the difference between the voltages $V_3$ and $V_4$ that are input to the ADC 110 is equal to the voltages $V_1$ and $V_2$ in the case where level shift is not performed, which makes it possible to detect an overcurrent to the laser diode 12 more accurately.

In the example in FIG. 8A, the voltage V2' is generated by stepping down the voltage $V_2$ by resistive voltage division performed by the resistors $131_2$ and $132_2$; however, the generation is not limited to the configuration. For example, the voltage V2' may be generated by stepping down the voltage $V_2$ using the same configuration as that of the source follower implemented by the transistor $150_2$, the resistor $151_2$ and the current source 104 described above.

Second Modification of Second Embodiment

A second modification of the second embodiment will be described next. The second modification of the second embodiment is obtained by further adding a configuration to measure a voltage $V_{DD}$ of a power supply to the configuration of the driver 10d according to the first modification of the second embodiment that is described using FIG. 8A.

Figure 9:
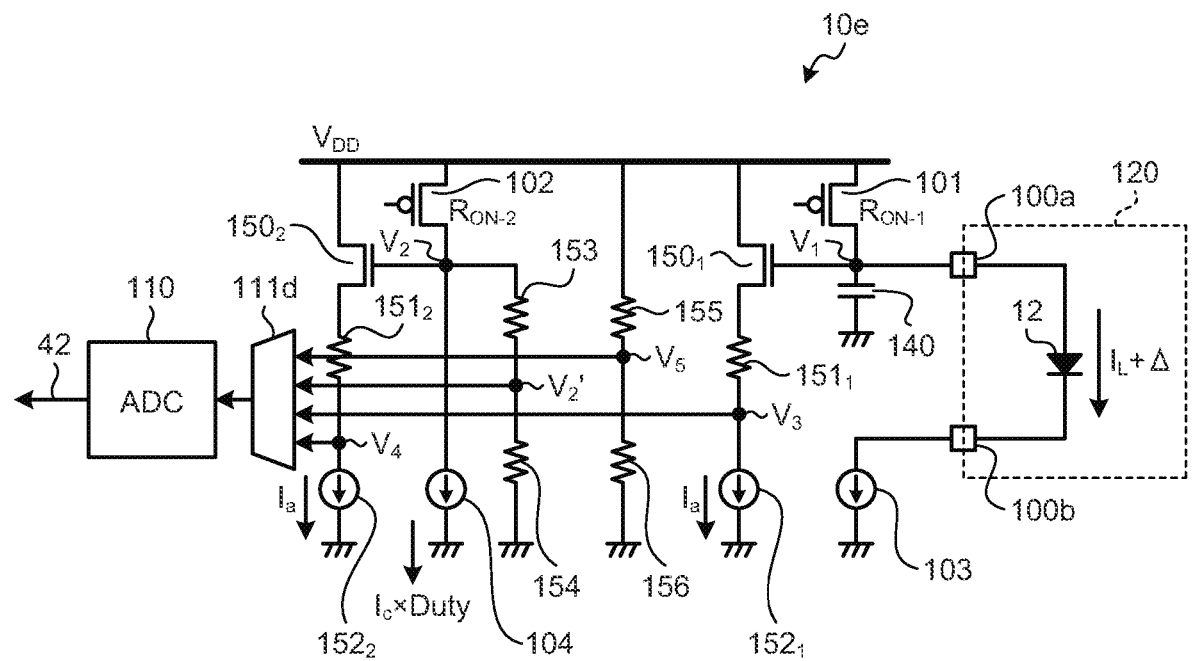
FIG. 9 is a diagram illustrating a configuration of an example of a driver according to a second modification of the second embodiment.

FIG. 9 is a diagram illustrating a configuration of an example of a driver 10e according to the second modification of the second embodiment. The driver 10e in FIG. 9 is obtained by adding resistors 155 and 156 that are connected to a power supply of a voltage $V_{DD}$ to the driver 10d in FIG. 8A. In other words, one end of the resistor 155 is connected to the power supply of the voltage $V_{DD}$ and the other end of the resistor 155 is connected to one end of the resistor 156. The other end of the resistor 156 is connected to a ground potential. A voltage $V_5$ obtained by stepping down the voltage $V_{DD}$ by resistive voltage division is taken out from a point of connection where the resistor 155 and the resistor 156 are connected to each other and is supplied to a selector 111d. A voltage $V_2'$ obtained by stepping down a voltage $V_2$ by resistive voltage division is taken out from a point of connection where a resistor 153 and a resistor 154 whose one end is connected to a point of connection where the transistor 102 and the current source 104 are connected to each other and whose the other end is connected to the ground potential and that are connected in series are connected to each other and the voltage $V_2'$ is supplied to the selector 111d.

The selector 111d sequentially selects the supplied voltages $V_2'$, $V_3$, $V_4$ and $V_5$ and supplies the voltages $V_2'$, $V_3$, $V_4$ and $V_5$ to the ADC 110. The ADC 110 performs AD conversion on the supplied voltages $V_2'$, $V_3$, $V_4$ and $V_5$ and supplies the result of the AD conversion to the controller 11.

The voltage $V_{DD}$ of the power supply is, for example, supplied to the driver 10e from the outside of a semiconductor chip on which the driver 10e is formed via wire bonding, or the like. In this case, the voltage $V_{DD}$ of the power supply may lower in the semiconductor chip on which the driver 10e is arranged, in a package, or interconnection in the chip or in the wiring in the chip or vary depending on the operation state.

Thus, in the second modification of the second embodiment, the voltage $V_5$ that is obtained by stepping down the voltage $V_{DD}$ of the power supply is supplied to the ADC 110. The ADC 110 performs AD conversation on the supplied voltage $V_5$ and supplies the result of the AD conversion to the controller 11. The controller 11 uses the voltage $V_5$ as the voltage $V_{DD}$ of the power supply in Equations (6) to (8) described above. This makes it possible to inhibit variations in the voltages $V_3$ and $V_4$ resulting from variations in the power supply voltage $V_{DD}$ and detect an overcurrent to the laser diode 12 more accurately.

In the example in FIG. 9, the voltage $V_2'$ is generated by stepping down the voltage $V_2$ by resistive voltage division performed by the resistors 153 and 154 and the voltage $V_5$ is generated by stepping down the voltage $V_{DD}$ by resistive voltage division performed by the resistors 155 and 156; however, the generation is not limited to the configuration. For example, the voltages $V_2'$ and $V_5$ may be generated by stepping down the voltages $V_2$ and $V_{DD}$ using the same configuration as that of the source follower implemented by the transistor $150_2$, the resistor $151_2$ and the current source 104 described above.

Third Embodiment

A third embodiment will be described next. The first embodiment, the second embodiment, and the modifications of the first embodiment and the second embodiment have been described as ones where each driver drives the single laser diode 12. On the contrary, a driver according to the third embodiment drives a plurality of the laser diodes 12.

Figure 10A:
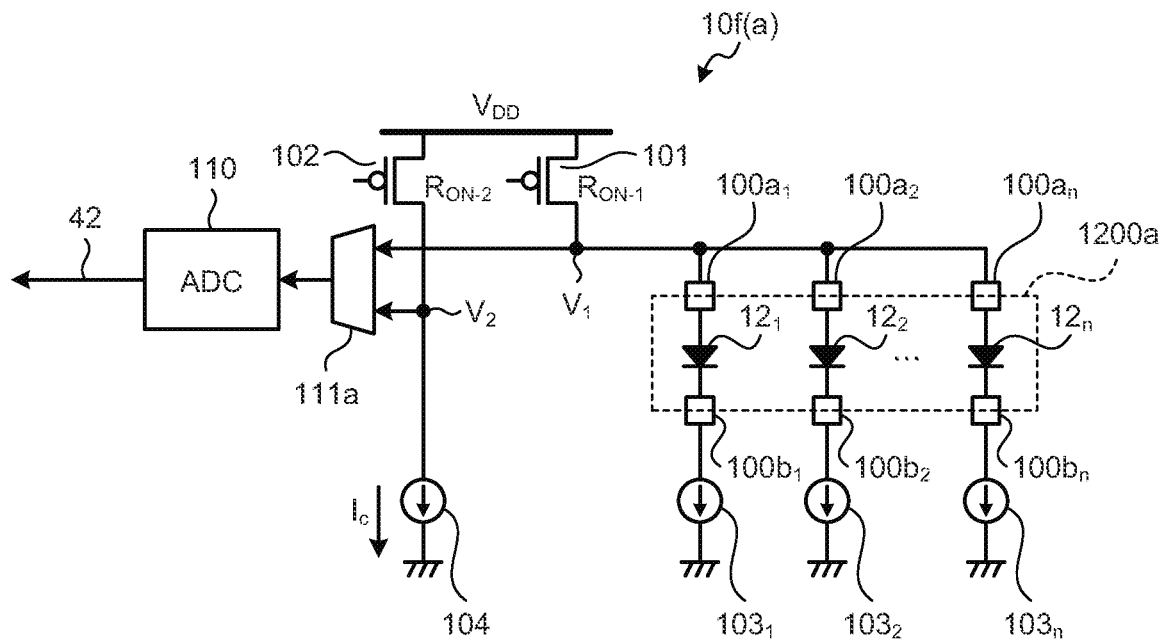
FIG. 10A is a diagram illustrating a first example of a configuration in the case of driving multiple laser diodes according to a third embodiment.
Figure 10B:
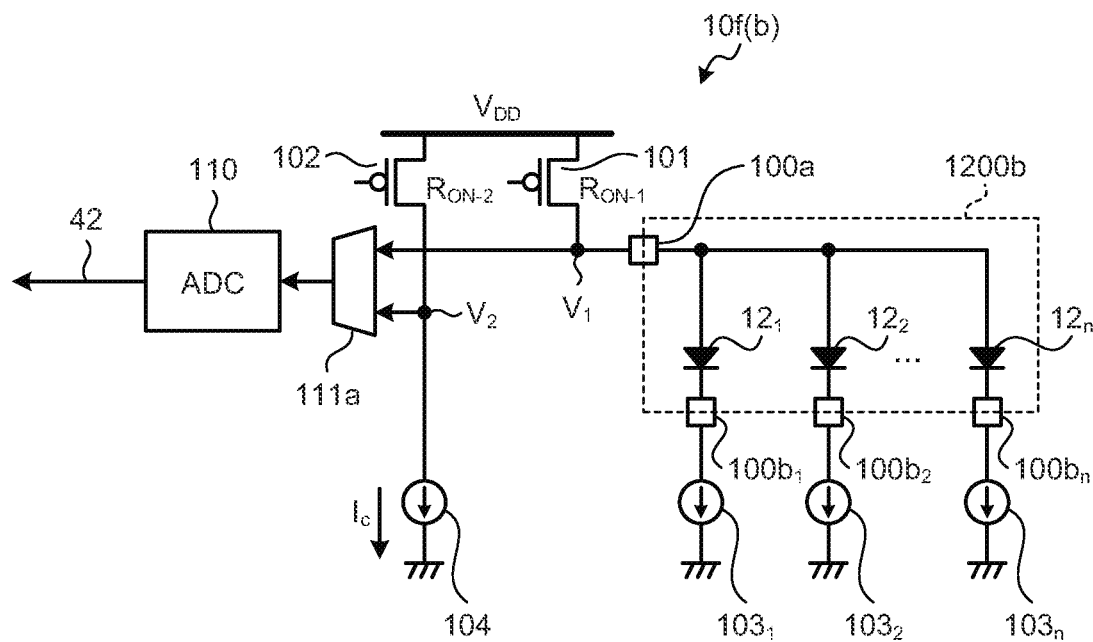
FIG. 10B is a diagram illustrating a second example of the configuration in the case of driving multiple laser diodes according to the third embodiment.
Figure 10C:
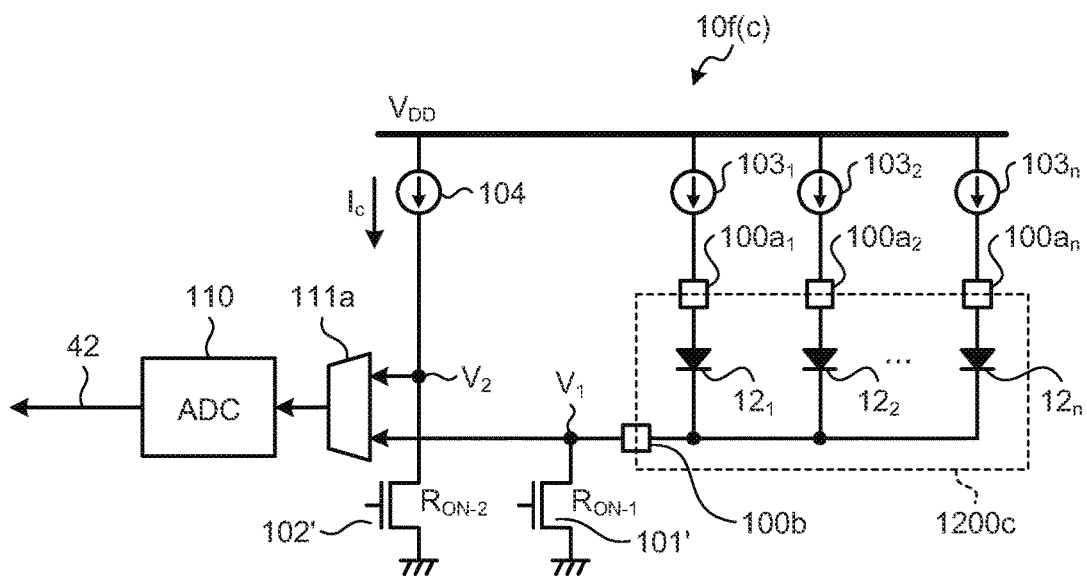
FIG. 10C is a diagram illustrating a third example of the configuration in the case of driving multiple laser diodes according to the third embodiment.

FIGS. 10A, 10B and 10C are diagrams illustrating first, second and third examples of a configuration in the case where the laser diodes 12 are driven according to the third embodiment. In FIGS. 10A, 10B, and 10C, the configurations of the transistor 102, the current source 104, the ADC 110 and the selector 111 are the same as those in FIG. 4 described above and detailed description thereof will be omitted.

According to FIGS. 10A and 10C, each of LD (laser diode) arrays 1200a, 1200b and 1200c including a plurality of laser diodes $12_1$, $12_2$, . . . , $12_n$ is connected to the drain of the transistor 101. The LD arrays 1200a, 1200b and 1200c are, for example, VCSELs (Vertical Cavity Surface Emitting LASER).

The laser diodes $12_1$, $12_2$, . . . , $12_n$ have one-one-one connections to current sources $103_1$, $103_2$, . . . , $103_n$ each of which is controllable independently. In other words, by controlling, for example, on/off of each of the current sources $103_1$, $103_2$, . . . , $103_n$ using a drive circuit not illustrated in the drawing, it is possible to independently control light emission by each of the laser diodes corresponding one-on-one to the current sources $103_1$, $103_2$, . . . , $103_n$.

FIG. 10A is a diagram illustrating an example of a configuration of a driver 10f(a) according to the first example in the case where the laser diodes 12 are driven according to the third embodiment. FIG. 10A illustrates an example of the LD array 1200a in which each of anodes and cathodes of each of the laser diodes $12_1$, $12_2$, . . . , $12_n$ is independent. In the LD array 1200a, the anodes of the respective laser diodes $12_1$, $12_2$, . . . , $12_n$ is connected to the drain of the transistor 101 respectively via joints $100a_1$, $100a_2$, . . . , $100a_n$. In the driver 10f(a), a voltage $V_1$ is taken out from a point of connection where each of the joints $100a_1$, $100a_2$, . . . , $100a_n$ and the drain of the transistor 101 are connected to each other and the voltage $V_1$ is supplied to the selector 111a.

The cathodes of the respective laser diodes $12_1$, $12_2$, . . . , $12_n$ have one-on-one connections to the current sources $103_1$, $103_2$, . . . , $103_n$ via joints $100b_1$, $100b_2$, . . . , $100b_n$.

FIG. 10B is a diagram illustrating an example of a configuration of a driver 10f(b) according to the second example of the case where the laser diodes 12 are driven according to the third embodiment. FIG. 10B illustrates an example of the LD array 1200b in which each of the anodes of the laser diodes $12_1$, $12_2$, . . . , $12_n$ is connected commonly and each of the cathodes is independent. In the LD array 1200b, each of the anodes of the respective laser diodes $12_1$, $12_2$, . . . , $12_n$ is connected commonly to the joint 100a and is connected to the drain of the transistor 101 via the joint 100a. In the driver 10f(b), a voltage $V_1$ is taken out from a point of connection where the joint 100a and the drain of the transistor 101 are connected to each other and is supplied to the selector 111a.

The cathodes of the laser diodes $12_1$, $12_2$, . . . , $12_n$ have one-on-one connection to the current sources $103_1$, $103_2$, . . . , $103_n$ via the joints $100b_1$, $100b_2$, . . . , $100b_n$.

FIG. 10C is a diagram illustrating a configuration example of the third example of a driver 10f(c) in the case where the laser diodes 12 are driven according to the third embodiment. FIG. 10C illustrates the example in which each of the anodes of the respective laser diodes $12_1$, $12_2$, . . . , $12_n$ is independent and each of the cathodes is connected commonly. The example in FIG. 10C corresponds to the example in FIG. 5A and each of the cathodes of the respective laser diodes $12_1$, $12_2$, . . . , $12_n$ is connected commonly to the joint 100b and is connected to the drain of the transistor 101' that is an N-channel MOS transistor via the joint 100b. In the driver 10f(c), a voltage $V_1$ is taken out from a point of connection where the joint 100b and the drain of the transistor 101' are connected to each other and is supplied to the selector 111a. In the example in FIG. 10C, the source of the transistor 101' is connected to a ground potential.

In FIG. 10C, the anodes of the respective laser diodes $12_1$, $12_2$, . . . , $12_n$ have one-on-one connection to the current sources $103_1$, $103_2$, . . . , $103_n$ via joints $100a_1$, $100a_2$, . . . , $100a_n$. In the example in FIG. 10C, ends of the current sources $103_1$, $103_2$, . . . , $103_n$ that are not connected to the joints $100a_1$, $100a_2$, . . . , $100a_n$ are connected to a power supply of a voltage $V_{DD}$.

In FIG. 10C, a transistor 102' on the replica path is an N-channel MOS transistor like the transistor 101' and the drain of the transistor 102' is connected to the current source 104 and the source of the transistor 102' is connected to a ground potential. A voltage $V_2$ is taken out from a point of connection where the drain of the transistor 102' and the current source 104 are connected to each other and is supplied to the selector 111a.

In any of the examples in FIGS. 10A, 10B and 10C, the voltage $V_1$ that is taken out of the main line is a voltage corresponding to the sum of the currents that flow through the respective laser diodes $12_1$, $12_2$, . . . , $12_n$. In other words, the current that is calculated by applying Equations (1) to (5) is the current of the sum. Thus, the current source 104 on the replica path need to supply a current $I_c$ corresponding to the current of the sum.

The current is not limited to this and, for example, it is possible to control each of the current sources $103_1$, $103_2$, . . . , $103_n$ individually and detect an overcurrent with respect to each of the laser diodes $12_1$, $12_2$, . . . , $12_n$.

As described above, even when the laser diodes $12_1$, $12_2$, . . . , $12_n$ are connected, overcurrents to the laser diodes $12_1$, $12_2$, . . . , $12_n$ are detectable.

First Modification of Third Embodiment

A first modification of the third embodiment will be described next. A first modification of the third embodiment is an example in which different currents are flown through the main line to which a plurality of the laser diodes 12 are connected and a replica path.

Figure 11:
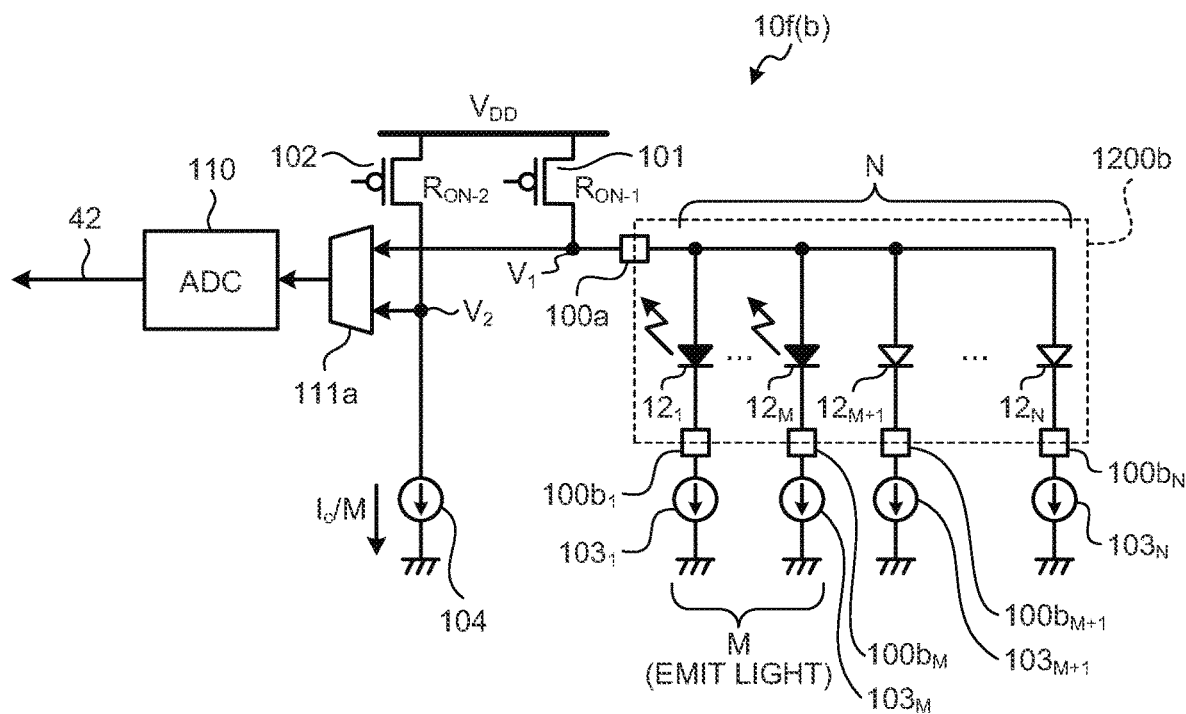
FIG. 11 is a diagram for explaining control according to a first modification of the third embodiment.

FIG. 11 is a diagram for explaining control according to the first modification of the third embodiment. FIG. 11 corresponds to FIG. 10B described above and, like the driver 10f(b) illustrated in FIG. 10B, on the main line, the transistor 101, the LD array 1200b including N laser diodes $12_1$ to $12_N$, the respective laser diodes $12_1$ to $12_N$, and respective current sources $103_1$ to $103_N$ are connected via joints $100b_1$, . . . , $100b_M$, $100b_{M+1}$, . . . , $100b_N$. The replica path contains the transistor 102 and the current source 104.

For example, the case where, as illustrated in FIG. 11, control is performed such that M laser diodes $12_1$ to $12_M$ among the N laser diodes $12_1$ to $12_N$ included in the LD array 1200b emit light and other (N−M) laser dioses $12_{M+1}$ to $12_N$ do not emit light is considered. In the first modification of the third embodiment, in this case, the current $I_c$ that the current source 104 on the replica path supplies is changed according to the number M of the laser diodes $12_1$ to $12_M$ that are caused to emit light. In the example in FIG. 11, the current source 104 supplies a current $I_c/M$.

For example, a drive circuit that is not illustrated in the drawing turns on the M current sources $103_1$ to $103_M$ corresponding one-on-one to the laser diodes $12_1$ to $12_M$ that are caused to emit light. The (N–M) current sources $103_{M+1}$ to $103_N$ corresponding one-on-one to the laser diodes $12_{M+1}$ to $12_N$ that are not caused to emit light are turned off. The drive circuit changes the current that is supplied by the current source 104 to the current $I_c/M$ according to the number of the current sources $103_1$ to $103_M$ that are turned on.

In other words, in order to cause each of the M laser diodes $12_1$ to $12_M$ to simultaneously emit a given amount of light by a current $I_L$, it is necessary to supply a current $I_L \times M$ to the LD array 1200b.

When the sum (the current $I_L \times M$) of the currents $I_L$ that are supplied to the M laser diodes $12_1$ to $12_M$ with an overcurrent contained is applied to Equation (5) described above, Equation (5) is expressed as Equation (9).

$$(I_L+\Delta) \times M = \{(V_{DD}-V_1)/(V_{DD}-V_2)\} \times I_c \qquad (9)$$

The change of the current that the current source 104 supplies to the current $I_c/M$ is equivalent to multiplying both the right-hand side and left-hand side of Equation (9) by 1/M. In other words, the left-hand side of Equation (9) is $(I_L+\Delta)/M = I_L+\Delta$. The current $I_L+\Delta$ is an average of currents supplied to the M laser diodes $12_1$ to $12_M$ that are caused to emit light in the LD array 1200b. By subtracting the known current $I_L$ from the current $I_L+\Delta$ of the average, it is possible to calculate a current $\Delta$ corresponding to an average overcurrent in the LD array 1200b.

As described, by changing the current $I_c$ that the current source 104 supplies on the replica path according to the number of the laser diodes $12_1$ to $12_M$ that are caused to emit light in the LD array 1200b, it is possible to reduce power consumption on the replica path.

Second Modification of Third Embodiment

A second modification of the third embodiment will be described. Each of the second modification of the third embodiment is an example of the case where the transistor 101 on a main line and the transistor 102 on a replica path is configured by connecting a plurality of transistors in parallel.

In the second modification of the third embodiment, in this case, as in the case of the first modification of the above-described third embodiment, M laser diodes $12_1$ to $12_M$ among N laser diodes $12_1$ to $12_N$ included in the LD array 1200b are caused to emit light. Among the transistors included in the transistor 101 on the main line, transistors corresponding in number to the laser diodes $12_1$ to $12_M$ that are caused to emit light are turned on. Similarly, among the transistors included in the transistor 102 on the replica line, transistors corresponding in number to the laser diodes $12^1$ to $12_M$ that are caused to emit light are turned on.

Figure 12:
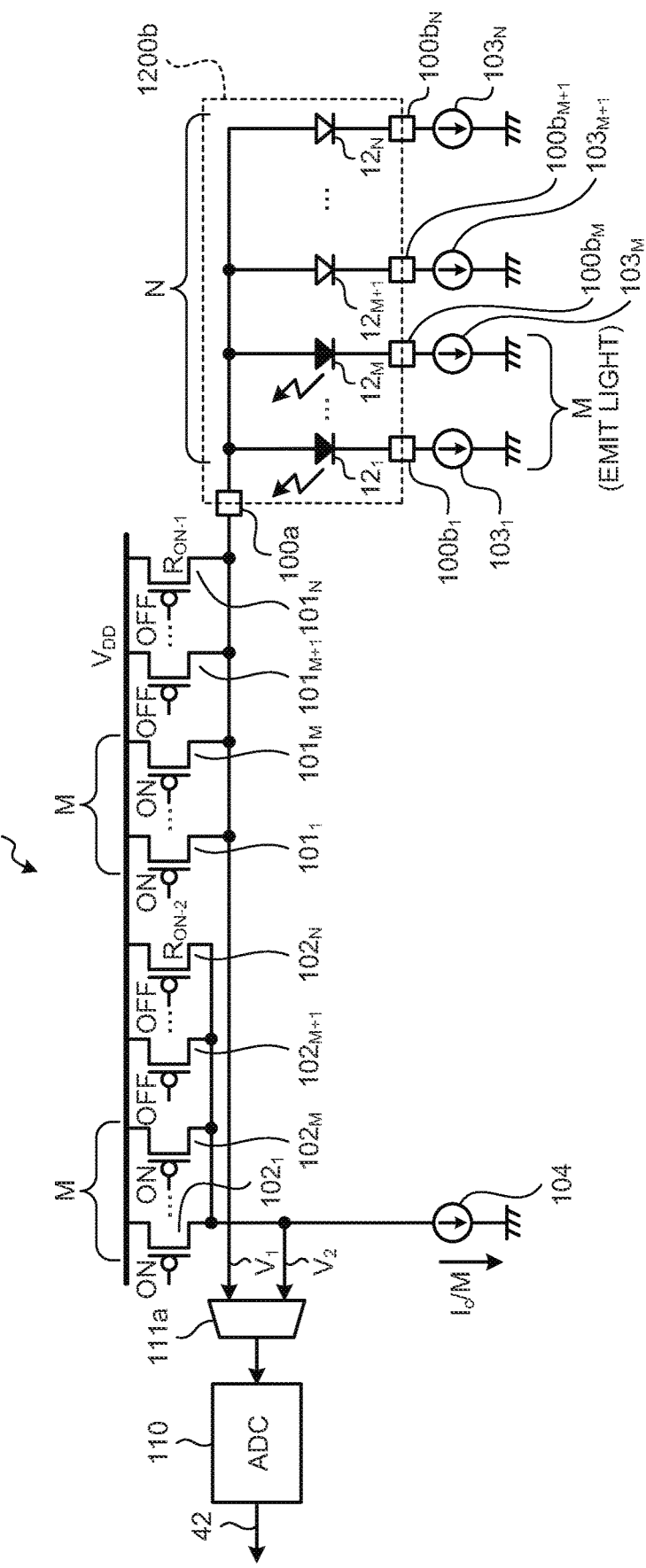
FIG. 12 is a diagram for explaining control according to a second modification of the third embodiment.

FIG. 12 is a diagram for explaining control according to the second modification of the third embodiment. FIG. 12 corresponds to FIG. 10B described above and a driver 10f(b)' includes, on the main line, N transistors $101_1$ to $101_N$, the LD array 1200b including N laser diodes $12_1$ to $12_N$, and N current sources $103_1$ to $103_N$ corresponding one-one-one to the laser diodes $12_1$ to $12_N$. The laser diodes $12_1$ to $12_N$ and the current sources $103_1$ to $103_N$ are connected to each other, respectively, via joints $100b_1, \ldots, 100b_M, 100b_{M+1}, \ldots, 100b_N$.

In FIG. 12, control signals each of which controls on/off are supplied, for example, from a drive circuit that is not illustrated in the drawing to the N transistors $101_1$ to $101_N$ that are connected in parallel. At least one transistor that is controlled at an on state among the transistors $101_1$ to $101_N$, for example, overall implements a function corresponding to the single transistor 101 illustrated in FIG. 11.

The drains of the respective transistors $101_1$ to $101_N$ are connected commonly to the joint 100a and are connected to the anodes of the respective laser diodes $12_1$ to $12_N$ included in the LD array 1200b via the joint 100a. A voltage $V_1$ is taken out from points of connection where the drains of the respective transistors $101_1$ to $101_N$ and the LD array 1200b are connected and is supplied to the selector 111a.

N transistors $102_1$ to $102_N$ that are connected in parallel and the single current source 104 are contained in the replica path. Controls signals to control on/off are supplied respectively to the gates of the transistors $102_1$ to $102_N$, for example, from a drive circuit that is not illustrated in the drawing. At least one transistor that is controlled at an on state among the transistors $102_1$ to $102_N$, for example, overall implements a function corresponding to the single transistor 102 illustrated in FIG. 11.

Each of the drains of the transistors $102_1$ to $102_N$ is connected commonly to the current source 104. A voltage $V_2$ is taken out from points of connection where the drains of the respective transistors $102_1$ to $102_N$ and the current source 104 are connected to each other and is supplied to the selector 111a.

The case where control is performed such that the M laser diodes $12_1$ to $12_M$ among the N laser diodes $12_1$ to $12_N$ included in the LD array 1200b emit light and other (N–M) laser dioses $12_{M+1}$ to $12_N$ do not emit light is considered.

In this case, in the second modification of the third embodiment, a drive circuit that is not illustrated in the drawing controls, at an on state, the M transistors $101_1$ to $101_M$ among the transistors $101_1$ to $101_N$ and controls other transistors $101_{M+1}$ to $101_N$ at an off state. Similarly, a drive circuit that is not illustrated in the drawing controls, at an on state, the M transistors $102_1$ to $102_M$ among the transistors $102_1$ to $102_N$ and controls other transistors $102_{M+1}$ to $102_N$ at an off state.

By controlling each of the transistors $101_1$ to $101_N$ according to the number M of the laser diodes $12_1$ to $12_M$ that emit light as described above, it is possible to increase the resistance value of the overall on-resistance $R_{ON-1}$ of the transistors $101_1$ to $101_N$. Similarly, by controlling each of the transistors $102_1$ to $102_N$ according to the number M of the laser diodes $12_1$ to $12_M$ that emit light, it is possible to increase the resistance value of the overall on-resistance $R_{ON-2}$ of the transistors $102_1$ to $102_N$. This makes it possible to improve accuracy in detecting the voltages $V_1$ and $V_2$.

As in the first modification of the third embodiment described above, it is possible to change the current $I_c$ that the current source 104 on the replica path supplies according to the number M of the laser diodes $12_1$ to $12_M$ that emit light. In the example in FIG. 12, the current source 104 supplies a current $I_c/M$. Accordingly, it is possible to reduce power consumption on the replica path.

The first modification and the second modification of the third embodiment have been described using the configuration according to the second example in the case where the laser diodes 12 are driven, which is described using FIG. 10B; however, this is not limited to the example. In other words, the first modification and the second modification of the third embodiment are applicable to the first example and the third example in the case where the laser diodes 12 are driven, which has been described using FIGS. 10A and 10C. The configurations according to the third embodiment and the modifications of the third embodiment are applicable to the first embodiment, the second embodiment, and the modifications of the first and second embodiments described above.

Fourth Embodiment

A fourth embodiment will be described next. The fourth embodiment relates to implementation of the driver 10f(a), 10f(b), 10f(b)' and 10f(c) and the LD arrays 1200a to 1200c according to the above-described third embodiment and each modification of the third embodiment.

The driver 10f(b) and the LD array 1200b in which the anodes of the respective laser diodes $12_1$ to $12_N$ are commonized, which are described using FIG. 10, are exemplified and described below. In this case, assume that, as illustrated in FIG. 12, the transistor 101 includes the transistors $101_1$ to $101_N$ that are connected in parallel and the transistor 102 includes the transistors $101^1$ to $101_N$ that are connected in parallel similarly.

Figure 13A:
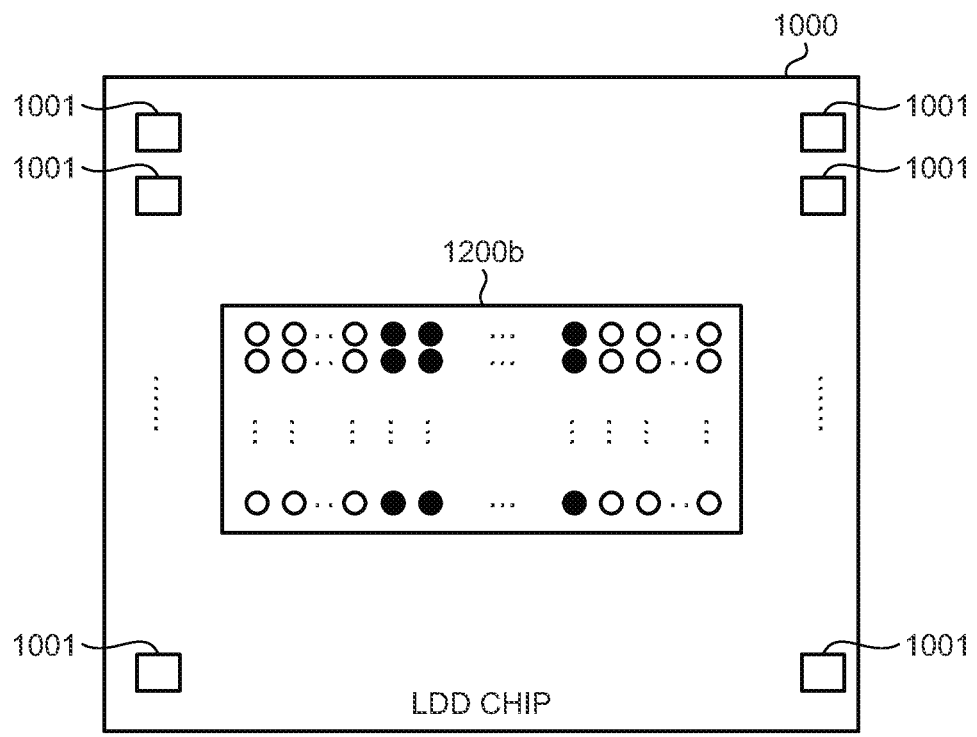
FIG. 13A is a diagram schematically illustrating an example of implementation of a driver and an LD array according to a fourth embodiment.
Figure 13B:
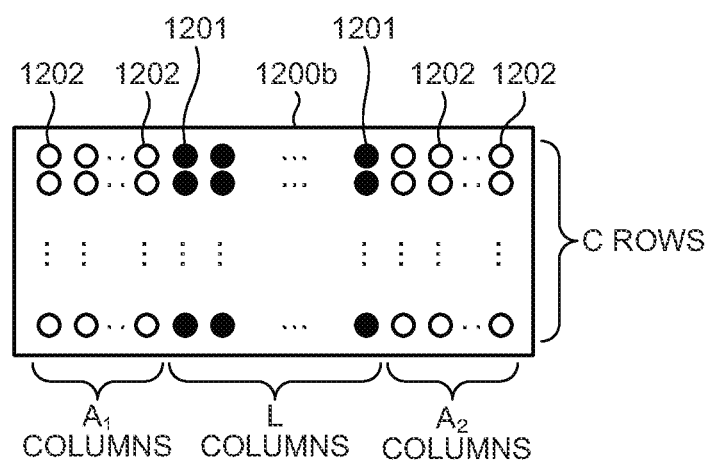
FIG. 13B is a diagram schematically illustrating the example of implementation of a driver and an LD array according to the fourth embodiment.
Figure 13C:
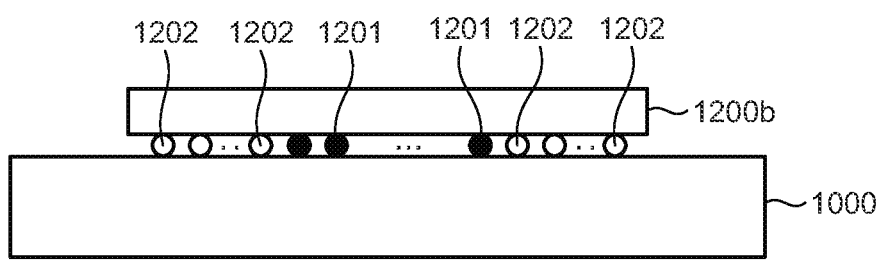
FIG. 13C is a diagram schematically illustrating the example of implementation of a driver and an LD array according to the fourth embodiment.

FIGS. 13A, 13B and 13C are diagrams schematically illustrating examples of implementation of the driver 10f(b) and the LD array 1200b according to the fourth embodiment. In the fourth embodiment, the LD array 1200b and other configurations included in the driver 10f(b) are formed on different boards.

FIG. 13A is a diagram schematically illustrating that the LD array 1200b is arranged on an LDD (laser diode driver) chip 1000 on which each element included in the driver 10f(b) is arranged, which is applicable to the fourth embodiment. FIG. 13A illustrates the LDD chip 1000 and the LD array 1200b viewed from its face (upper surface) on which light emitters of the respective laser dioses 12 included in the LD array 1200b are arranged. FIGS. 13A and 13B to be described below illustrate the side (back surface) of the LD array 1200b that is connected to the LDD chip 1000 viewed perspectively from the upper surface side on which the light emitters of the laser diodes 12 are arranged.

The LDD chip 1000 is a single semiconductor chip and is connected to an external circuit by wire bonding on a plurality of pads 1001 that are arranged on the margins. For example, a power of a voltage $V_{DD}$ is supplied from the outside to the LDD chip 1000 via the pads 1001. The voltages $V_1$ and $V_2$ in FIG. 10B are supplied to the ADC 110 that is arranged outside the LDD chip 1000 via the pads 1001.

The selector 111a can be arranged in the LDD chip 1000. Not limited to this, the selector 111a may be arranged outside the LDD chip 1000. In this case, the voltages $V_1$ and $V_2$ are supplied to the selector 111a via the pads 1001 and an output of the selector 111a is similarly supplied to the ADC 110 that is arranged outside the LDD chip 1000.

FIG. 13B is a diagram schematically illustrating a configuration of the LD array 1200b that is applicable to the fourth embodiment. As illustrated in FIG. 13B, cathode terminals 1201 of the respective laser diodes 12 included in the LD array 1200b and anode terminals 1202 that are common to the laser diodes 12 are arranged alignedly on the back surface of the LD array 1200b.

In the example in FIG. 13B, when the horizontal direction on the drawing represents rows and vertical direction represents columns, the cathode terminals 1201 are arranged at the center of the LD array 1200b in a matrix array of C rows×L columns. In other words, in the example, (C×L) laser diodes 12 are arranged on the LD array 1200b. The anode terminals 1202 are arranged in a matrix array of C rows×$A_1$ columns on the left end side and a matrix array of C rows×$A_2$ columns on the right end side.

The cathode terminals 1201, for example, correspond respectively to the joints $100b_1$, $100b_2$, ..., $100b_n$ in FIG. 10B. The anode terminals 1202, for example, collectively correspond to the joint 100a in FIG. 10B. Forming the joint 100a to which the anodes of the respective laser diodes 12 are connected commonly in multiple parts by using the anode terminals 1202 makes it possible to reduce connection resistance on connection of each anode to the LDD chip 1000.

FIG. 13C is a side view of a structure consisting of the LDD chip 1000 and the LD array 1200b viewed from the lower end side on FIG. 13A, which is applicable to the fourth embodiment. The LDD chip 1000 and the LD array 1200b form a structure in which the LD array 1200b is superimposed onto the LDD chip 1000. Each of the cathode terminals 1201 and the anode terminals 1202 is connected to the LDD chip 1000, for example, by a microbump.

Using FIGS. 14A and 14B, the example of arrangement of each element included in the driver 10f(b) on the LDD chip 1000 will be described.

Figure 14A:
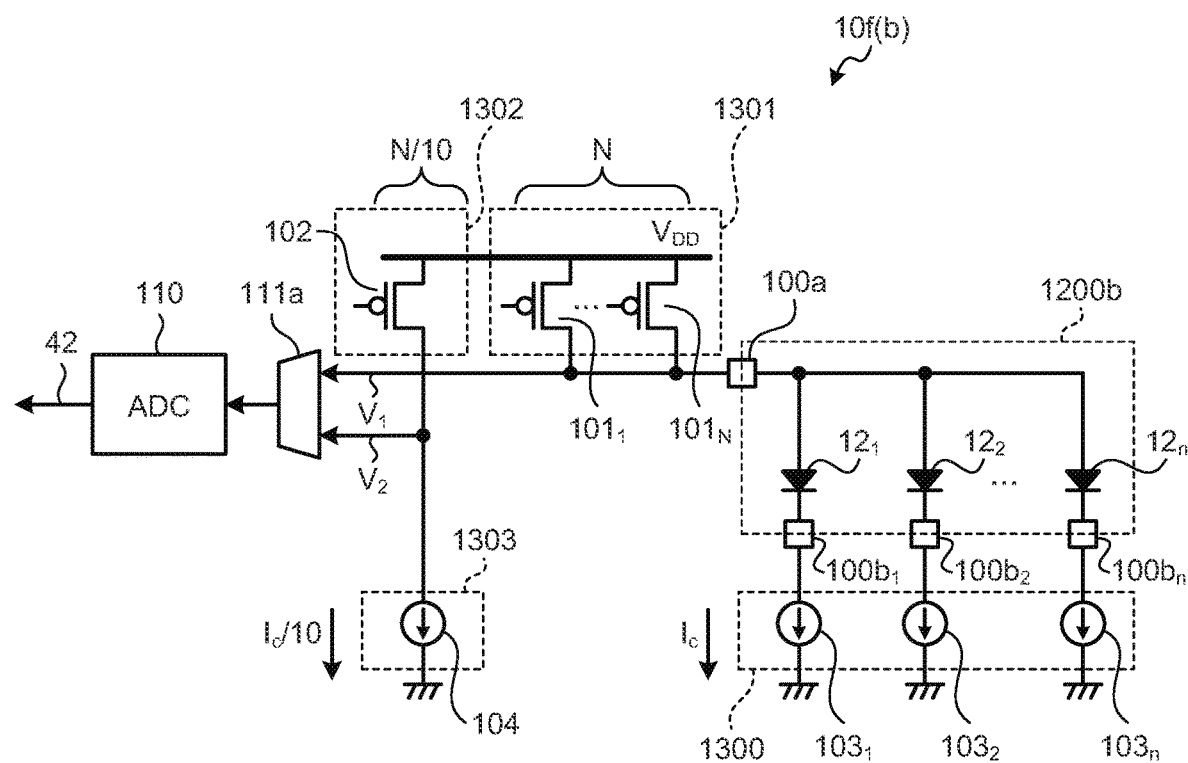
FIG. 14A is a diagram for explaining an example of arrangement of each element contained in the driver on an LDD chip according to the fourth embodiment.

FIG. 14A is a diagram corresponding to FIG. 10B described above. In the example in FIG. 14A, in the driver 10f(b), the size of the transistor 102 in FIG. 10B is smaller than the size of the transistor 101. For example, in contrast with single transistor 102, the transistor 101 consists of transistors $101_1$ to $101_N$ that are connected in parallel and on each of which on/off control can be performed independently. In the example in FIG. 14A, N/10 transistors 102 are used in contrast with the N transistors $101_1$ to $101_N$. For example, when N=10, the number of transistors 102 is one.

This makes it possible to maintain the overall n-resistance $R_{ON\text{-}2}$ of the transistor 102 higher than the on resistance $R_{ON\text{-}1}$ of the transistors $101_1$ to $101_N$. Furthermore, it is possible to reduce the current $I_C$ of the current source 104 on the replica path based on a ratio between the size (number) of the transistor 102 and the overall size (number) of the transistors $101_1$ to $101_N$.

In the example in FIG. 14A, the current that is supplied by the current source 104 is $I_C/10$ that is 1/10 of the current $I_c$ of the current source 104 in the example in FIG. 10B. According to Equation (1), it is known that the value of the calculated voltage $V_2$ does not change even when the on-resistance $R_{ON\text{-}2}$ of the transistor 102 is increased tenfold and the current $I_C$ is 1/10. The current on the replica path can be reduced as described above and thus power consumption in the LDD chip 1000 can be reduced. In the example in FIG. 14A, the size of the transistor 102 is increased tenfold and the amount of current on the replica path is 1/10; however, power consumption can be further reduced by the same method.

In FIG. 14A, the transistor 102 is illustrated as a single element; however, the transistor 102 may be configured by a plurality of transistors that are connected in parallel and on each of which on/off control can be performed independently.

Figure 14B:
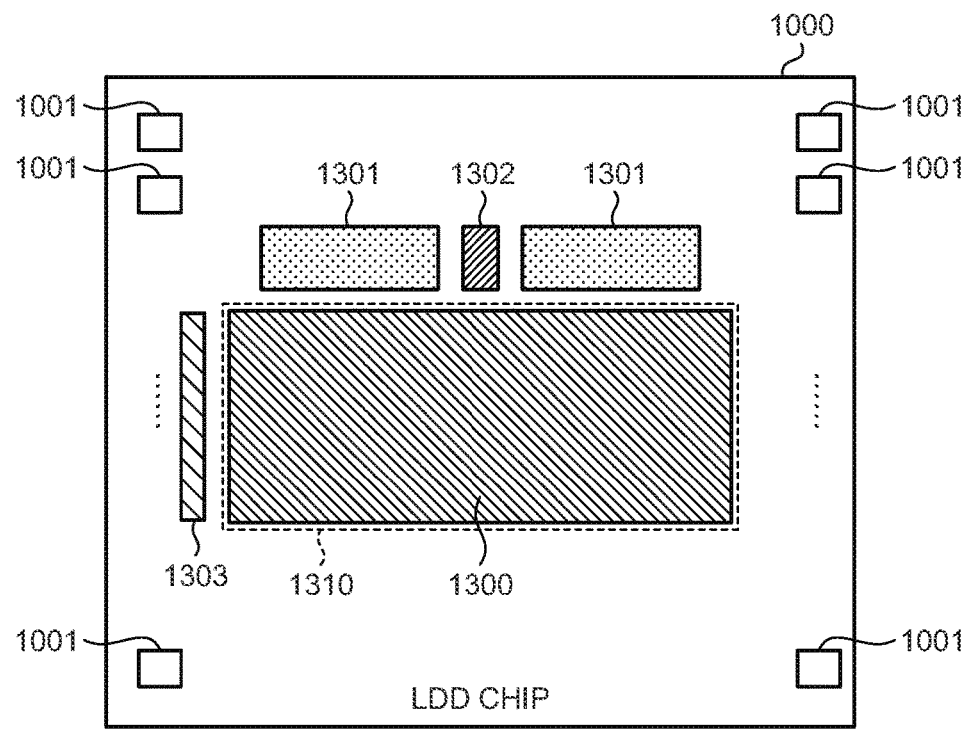
FIG. 14B is a diagram for explaining the example of arrangement of each element contained in the driver on the LDD chip.

FIG. 14B is a diagram illustrating an example of arrangement of each element of the driver 10f(b) on the LDD chip 1000, which is applicable to the fourth embodiment. In areas 1300, 1301, 1302 and 1303 in FIG. 14B, the respective elements surrounded and represented in association with the areas 1300, 1301, 1302 and 1303 by the dotted frames in FIG. 14A are arranged.

Specifically, in the example in FIG. 14B, the area 1300 contains the current sources $103_1$, $103_2$, ..., $103_n$. In the example in FIG. 14B, the LD array 1200b is arranged in an area 1310 corresponding to the area 1300. In FIG. 14B, the areas 1301 and the area 1302 are arranged on the longer side of the area 1300. The areas 1301 contains the transistors 101₁ to 101_N. The area 1302 contains the transistor 102. In the example in FIG. 14B, as for the areas 1301, the two areas 1301 in which each of the transistors 101₁ to 101_N that are divided into two groups is contained are arranged on both sides of the area 1302. Arranging the transistor 102 such that the transistor 102 is closely to and sandwiched by the transistors 101₁ to 101_N enables approximation between features of the transistors 101₁ to 101_N and the transistor 102.

In FIG. 14B, furthermore, the area 1303 containing the current source 104 is arranged on the short side of the area 1300.

In FIG. 14B, the area 1300 in which the current sources 103₁ to 103_n are contained is arranged in contrast to the area 1310 in which the LD array 1200b is arranged; however, the arrangement is not limited to this example. For example, in addition to the area 1300 in which the current sources 103₁ to 103_n are contained, other elements may be arranged in the area 1310. The area 1300 in which the current sources 103₁ to 103_n are contained may be arranged in another position on the LDD chip 1000. Furthermore, a drive circuit that drives each of the current sources 1031 to 103n, or the like, and that is not illustrated in the drawing may be arranged on the LDD chip 1000.

Example of Case Where Capacitor is Arranged

Figure 15A:
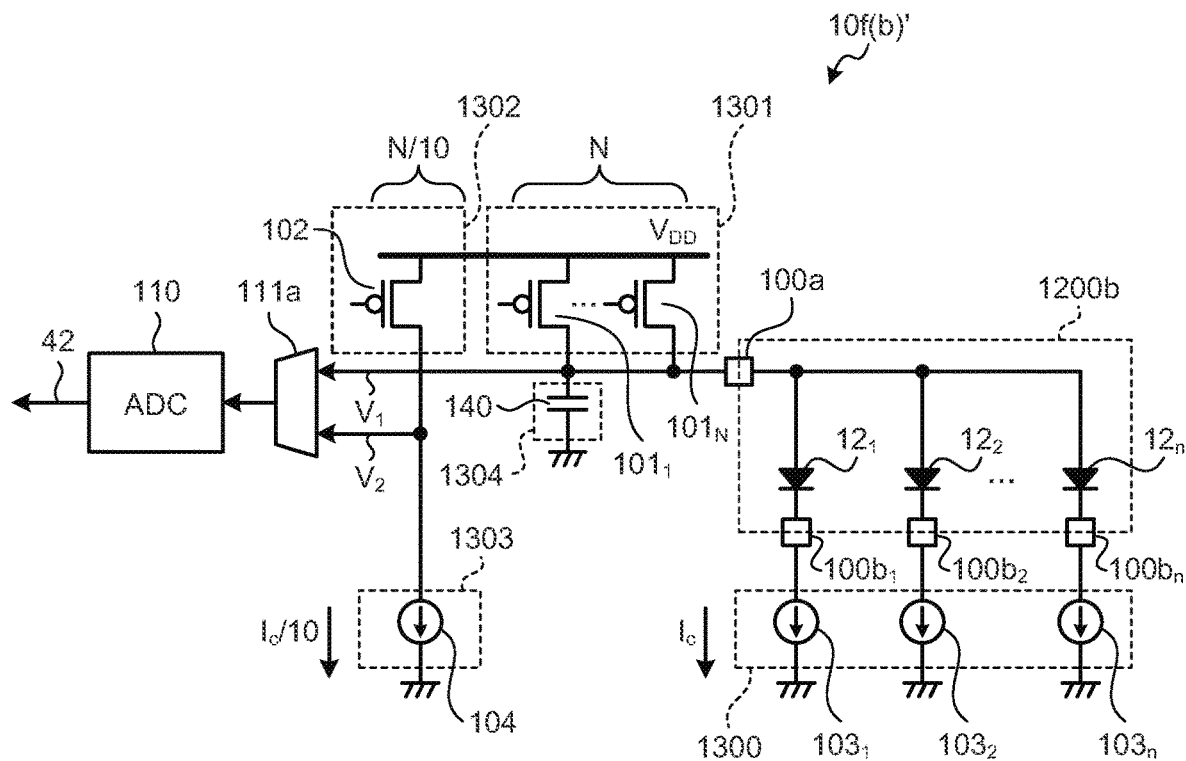
FIG. 15A is a diagram for explaining an example in the case where a capacitor is further arranged on the LDD chip according to the fourth embodiment.

An example of the case where a capacitor is further arranged on the LDD chip 1000 will be described using FIGS. 15A, 15B and 15C. FIG. 15A is a diagram illustrating an example in which the capacitor 140 that is commonly connected to the drains of the respective transistors 101₁ to 101_n is added to the configuration in FIG. 14A.

As described using FIGS. 7 and 8A, the capacitor 140 stores a charge corresponding to the voltage $V_{DD}$ of the power that is supplied via each of the transistors 101₁ to 101_n. When current supply to the laser diodes 12₁ to 12_n included in the LD array 1200b performed by the respective current sources 103₁ to 103_n is performed by PWM drive, current supply to each of the laser diodes 12₁ to 12_n is performed by using the charge stored in the capacitor 140.

In other words, the voltage $V_{DD}$ of the power is supplied from a board outside the LDD chip 1000 to the pads 1001 on the LDD chip 1000 by wire bonding. When a steep voltage change occurs due to PWM drive, a large voltage drop occurs due to inductance of wires that are used for wire bonding. Thus, supplying a current $I_L$ based on the charge stored in the capacitor 140 to each of the laser diodes 12₁ to 12_n makes it possible to avoid an effect of this voltage drop.

Figure 15B:
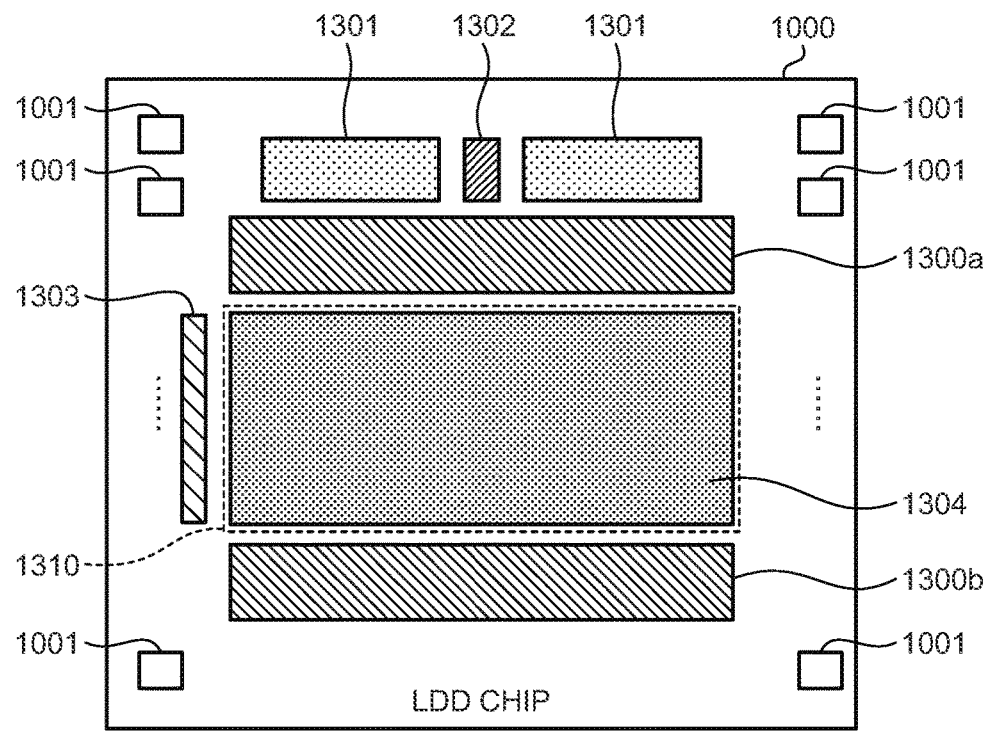
FIG. 15B is a diagram for explaining the example in the case where a capacitor is further arranged on the LDD chip according to the fourth embodiment.

FIG. 15B is a diagram illustrating an example in which an area 1304 containing the capacitor 140 is arranged on the LDD chip 1000. The capacitor 140 has a size relatively large compared to each of the transistors 101₁ to 101_n and the transistor 102. Thus, in the example in FIG. 15B, the area 1304 containing the capacitor 140 is arranged in a position corresponding to the area 1310 in which the LD array 1200b is arranged. The area 1304 containing the capacitor 140 has a relatively large size as described above and thus such arrangement makes it easy to design a layout on the LDD chip 1000.

In the example in FIG. 15B, the area 1300 containing each of the current sources 103₁ to 103_n is divided into two area and the two areas are arranged on both outer sides of the long sides of the area 1304.

The example in FIG. 15B illustrates that the whole area 1304 containing the capacitor 140 is contained in the area 1310 in which the LD array 1200b is arranged; however, the arrangement is not limited to this example. For example, the area 1304 may be arranged such that part of the area 1304 is contained in the area 1310. When the size of the area 1304 is small with respect to the area 1310, another element may be arranged together with the area 1304 in a position corresponding to the area 1310.

FIG. 15C is a diagram illustrating an example obtained by, in the example illustrated in FIG. 15B in which the area 1304 containing the capacitor 140 is arranged on the LDD chip 1000, dividing the area 1310 containing each of the transistors 101₁ to 101_n into multiple areas 1301 and dividing the area containing the transistor 102 into multiple areas 1302. In this case, assume that the transistor 102 consists of multiple transistors that are connected in parallel like each of the transistors 101₁ to 101_n and on each of which on/off control can be performed independently.

When the overall size of the transistors 101₁ to 101_n and the size of the transistor 102 consisting of the transistors are relatively larger, variation resulting from the process on manufacturing may occur in each of the transistors. In the example in FIG. 15C, the area 1301 in which each of the transistors 101₁ to 101_n is contained and the area 1302 in which the transistors of which the transistor 102 consists are divided in more small units and furthermore the divided areas 1301 and 1302 are arranged alternately. This makes it possible to reduce variations in the transistors 101₁ to 101_n and the transistors of which the transistor 102 consists.

The configuration corresponding to FIG. 4 described above is applied to FIGS. 14A and 15A described above and voltages $V_1$ and $V_2$ are taken out of the main path and the replica path directly; however, the configuration is not limited to this example. In other words, the configurations described using FIGS. 6, 7, 8A and 9 are applicable to the configurations in FIGS. 14A and 15A.

Instead of the LD array 1200b, the LD array 1200a to which each of the laser diodes 121 to 12n is connected independently may be used. Similarly, instead of the LD array 1200b, an LD array 1200c to which the anodes of the laser diodes 121 to 12n, which have been described using FIGS. 10A, 10B, and 10C, are connected commonly may be used.

Fifth Embodiment

A fifth embodiment will be described. The fifth embodiment is an example of the case where the light source device 1 according to each of the above-described embodiments and the modifications of the embodiments is applied to a ranging device that measures a distance by laser light.

Figure 16:
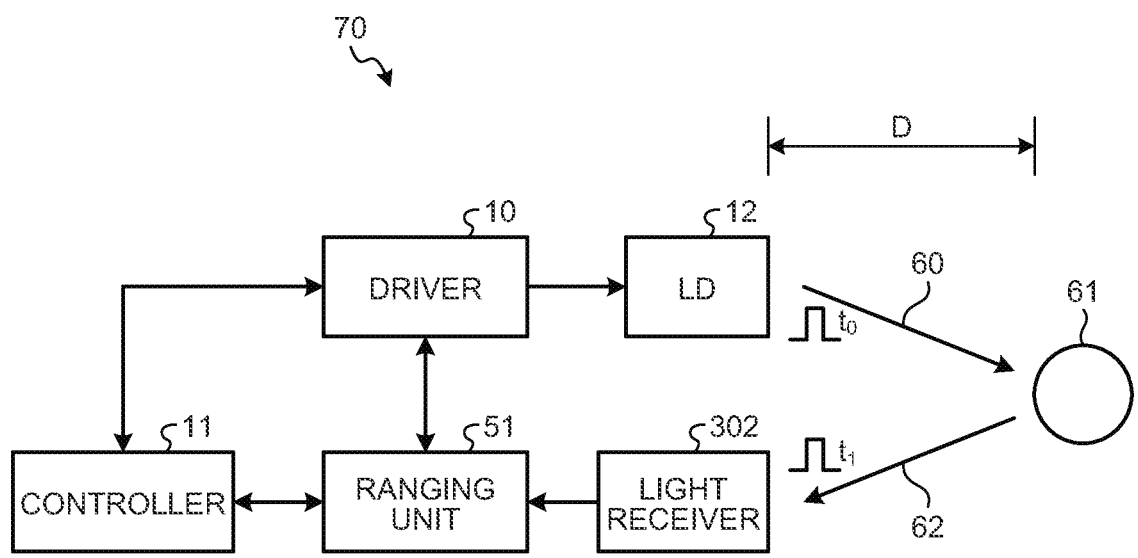
FIG. 16 is a block diagram illustrating a configuration of an example of a ranging device according to a fifth embodiment.

FIG. 16 is a block diagram illustrating an example of a ranging device according to the fifth embodiment. Represented by the driver 10, the drivers 10a to 10e and the drivers 10f(a) to 10f(c) according to the respective embodiments and modifications of the embodiments described above will be described below. Similarly, represented by the laser diode 12, the laser diode 12, the laser diodes 12₁ to 12_n, and the laser diodes 12₁ to 12_N, will be described. More preferably, the configurations described using FIGS. 15B and 15C would be applied.

A ranging device 70 serving as an electronic device according to the fifth embodiment includes the driver 10, the laser diode 12, the controller 11, a ranging unit 51, and a light receiver 302. The driver 10 generates a drive signal (refer to FIG. 8B) that drives the laser diode 12 to emit light according to a pulse in response to a control signal that is supplied from the controller 11 and, based on the generated drive signal, causes the laser diode 12 to emit light. The driver 10 passes a signal representing the timing at which the laser diode 12 is caused to emit light to the ranging unit 51.

Based on the detection signal 42 that is supplied from the driver 10, the controller 11 determines whether an overcurrent is supplied to the laser diode 12. When it is determined that an overcurrent is supplied to the laser diode 12, the controller 11 outputs the control signal 43 to stop the laser diode 12 from emitting light to the driver 10 and outputs an error signal indicating supply of an overcurrent. The controller 11 is able to output the error signal, for example, to the outside of the ranging device 70.

The light receiver 302 includes a light receiving element that outputs a received light signal by photoelectric conversion based on received laser light. For example, a single photon avalanche diode may be used as the light receiving element. A single photon avalanche diode is also referred to as a SPAD (Single Photon Avalanche Diode) and has a characteristic in that electrons that are generated according to incidence of one photon causes avalanche multiplication and a high current flows. By utilizing the characteristic of the SPAD, it is possible to sense incidence of one photon with high sensitivity. The light receiving element applicable to the light receiver 302 is not limited to a SPAD and an avalanche photodiode (APD) and a normal photodiode are also applicable.

The ranging unit 51 calculates a distance D between the ranging unit 51 and a subject 61 based on a time $t_0$ at which laser light is emitted from the laser diode 12 and a time $t_1$ at which the light is received by the light receiver 302.

In the above-described configuration, laser light 60 that is emitted, for example, at the timing of the time $t_0$ is reflected off the subject 61 and is received as reflected light 62 by the light receiver 302 at timing of the time $t_1$. Based on a difference between the time $t_1$ at which the light receiver 302 receives the reflected light 62 and the time $t_0$ at which the laser diode 12 emits light, the ranging unit 51 calculates the distance D to the subject 61. The distance D is calculated by Equation (10) below, using a constant c as a velocity of light ($2.9979 \times 10^8$ [m/sec]).

$$D = (c/2) \times (t_1 - t_0) \tag{10}$$

The ranging unit repeatedly executes the above-described process for multiple times. The light receiver 302 includes a plurality of light receiving elements and the light receiver 302 may calculate each distance D based on each light receiving timing of reception of the reflected light 62 by each of the light receiving elements. The ranging unit 51 classifies times $t_m$ (referred to as light reception time $t_m$) each from the time $t_0$ of light emission timing to light reception timing of light reception by the light receiver 302 based on grades (bins) and generates a histogram.

The light that is received at the light reception time $t_m$ is not limited to the reflected light 62 that is light emitted by the laser diode 12 and reflected off the object on which measurement is performed. For example, environment light around the light receiver 302 is also received by the light receiver 302.

Figure 17:
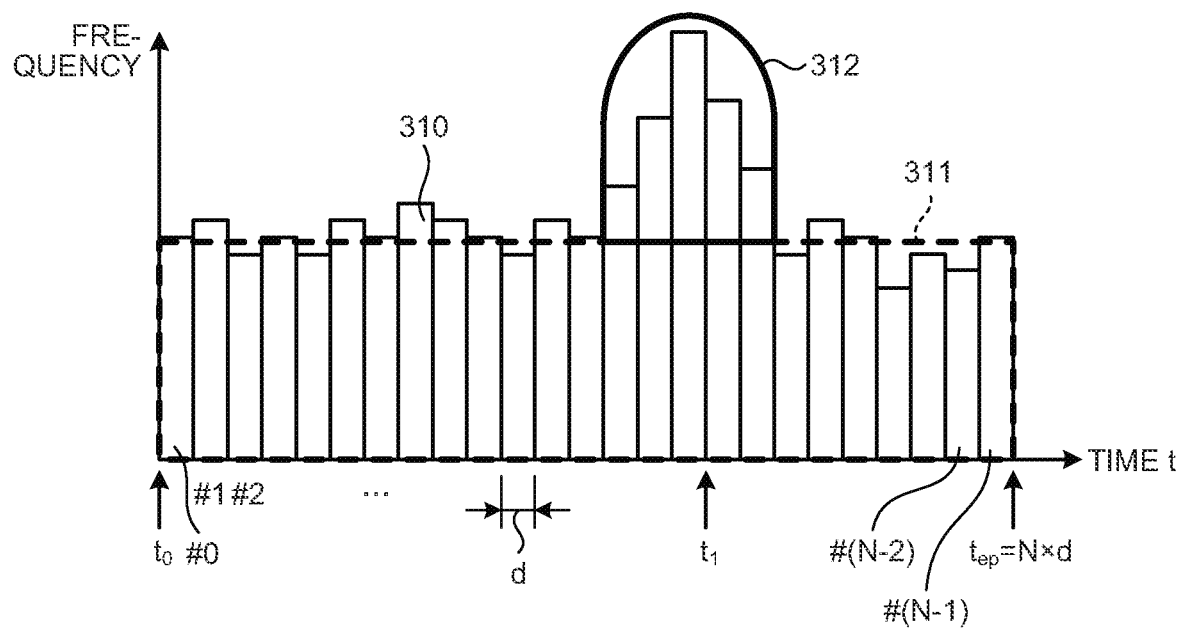
FIG. 17 is a diagram illustrating a histogram of an example based on times at each of which a light receiver receives light, which is applicable to the firth embodiment.

FIG. 17 is a diagram illustrating an exemplary histogram based on times at which the light receiver 302 receives light, which is applicable to the fifth embodiment. In FIG. 17, the horizontal axis represents bins, the vertical axis represents frequency per bin. The bins are obtained by classifying the light receiving times $t_m$ by each given unit time d. Specifically, a bin #0 is $0 \le t_m < d$, a bin #1 is $d \le t_m < 2 \times d$, a bin #2 is $2 \times d \le t_m < 3 \times d$, ..., a bin #(N−2) is $(N-2) \times d \le t_m < (N-1) \times d$. When the time of exposure of the light receiver 302 is $t_{ep}$, $t_{ep} = N \times d$.

The ranging unit 51 counts the number of times a light reception time $t_m$ is acquired based on bins and calculates a frequency 310 per bin and generates a histogram. The light receiver 302 receives light other than the reflected light that is light emitted from the laser diode 12 and reflected. As an example of light other than the subject reflected light, there is environment light that is aforementioned. The part indicated by an area 311 in the histogram contains environment light components resulting from environment light. The environment light is light that is randomly incident on the light receiver 302 and results in noise against the subject reflected light.

On the other hand, the subject reflected light is light that is received according to a specific distance and appears as an active light component 312 in the histogram. A bin corresponding to the frequency at the peak in the active light component 312 serves as a bin corresponding to the distance D of a measurement subject object 303. By acquiring the representative time of the bin (for example, the center time of the bin) as the above-described time $t_1$, the ranging unit 51 is able to calculate a distance D to the measurement subject object 303 according to Equation (10) described above. As described above, using multiple results of light reception enables execution of appropriate distance measurement against random noise.

As described above, by applying the driver 10 according to the disclosure to the ranging device 70 that measures a distance by a direct ToF method, it is possible to detect whether an overcurrent is supplied to the laser diode 12 more accurately. By controlling light emission by the laser diode 12 based on the result of the detection, for example, it is possible to reduce an effect on the eyes in the case were laser light more intense than expected is emitted from the laser diode 12 due to an overcurrent. Furthermore, it is possible to prevent break of the elements of the laser diode 12 due to an overcurrent, which increase reliability of the ranging device 70.

Sixth Embodiment

Figure 18:
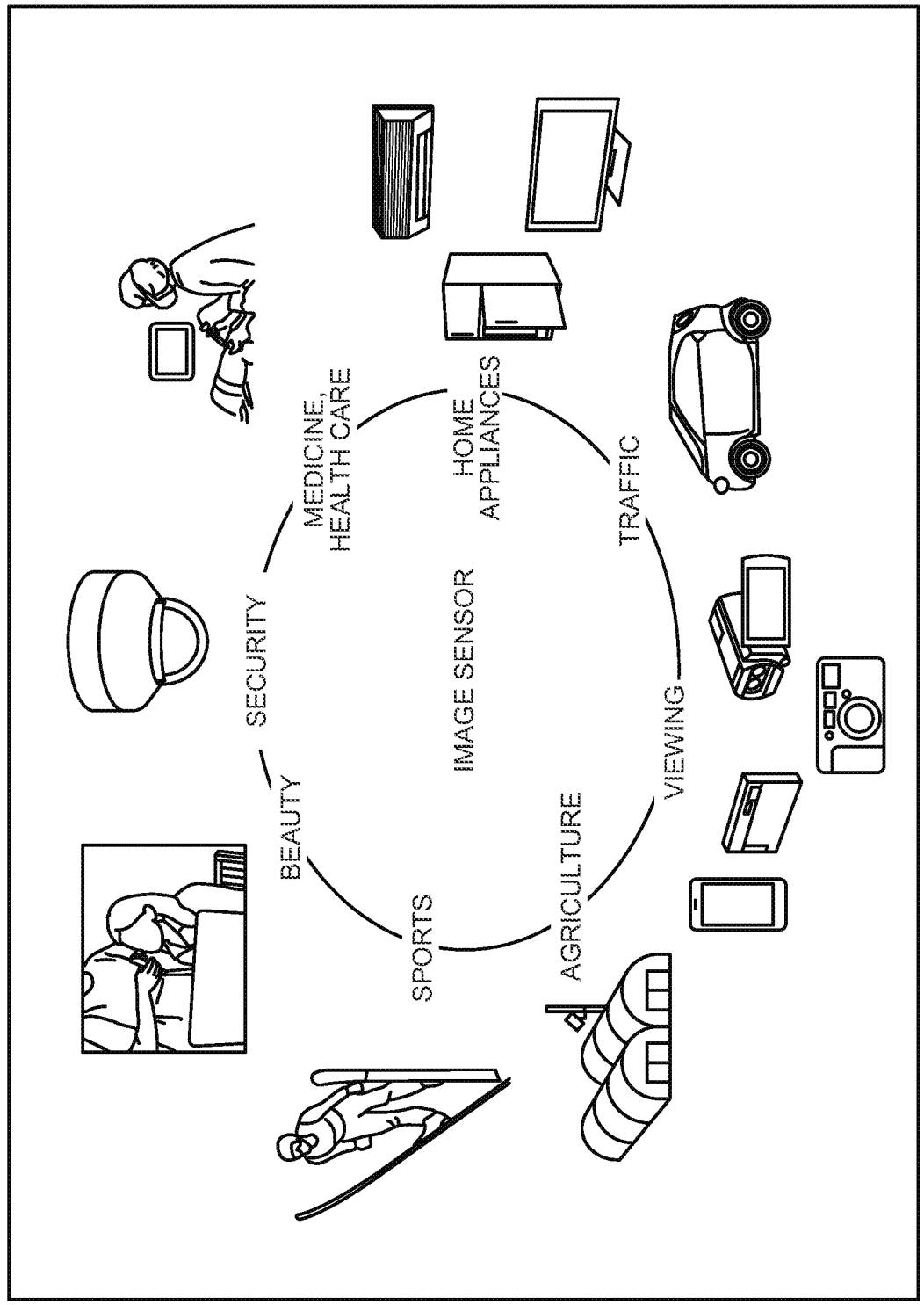
FIG. 18 is a diagram illustrating a use example in which the raging device according to the fifth embodiment is used according to a sixth embodiment.

An example of application of the fifth embodiment of the disclosure will be described as a sixth embodiment of the disclosure. FIG. 18 is a diagram illustrating a use example according to the sixth embodiment in which the ranging device 70 according to the above-described fifth embodiment is used.

The above-described ranging device 70 is usable in various cases in which light, such as visible light, infrared light, ultraviolet light and X-rays, is sensed as described below.

A device that captures images that are used for ornamental purposes, such as a digital camera or a portable device with a camera function.

A device used for traffic purposes, such as an on-board sensor that captures images of the front and back views, the surroundings, and the inside of a vehicle for safe driving, such as automatic stopping, recognition of the condition of a driver, etc., a monitoring camera that monitors a traveling vehicle and a road, or a ranging sensor that measures a distance between vehicles.

A device used for home appliances, such as a TV set, a refrigerator, and an air conditioner, in order to capture images of gestures of a user and operate devices according to the gestures.

A device used for medicine and healthcare, such as an endoscope or a device that captures images of blood vessels by receiving infrared light.

A device used for security, such as a crime prevention monitoring camera or a personal authentication camera.

A device used for beauty, such as a skin measurement device or a microscope that captures images of a scalp.

A device used for sports, such as an action camera or a wearable camera for sports, etc.

A device used for agriculture, such as a camera for monitoring the condition of fields and products.

Further Application Example of Technique According to Disclosure

The technique according to the disclosure may be applied to a device that is mounted on various mobile objects, such as an automobile, an electronic vehicle, a hybrid electronic vehicle, a motorcycle, a bicycle, a personal mobility, an airplane, a drone, a ship, and a robot.

Figure 19:
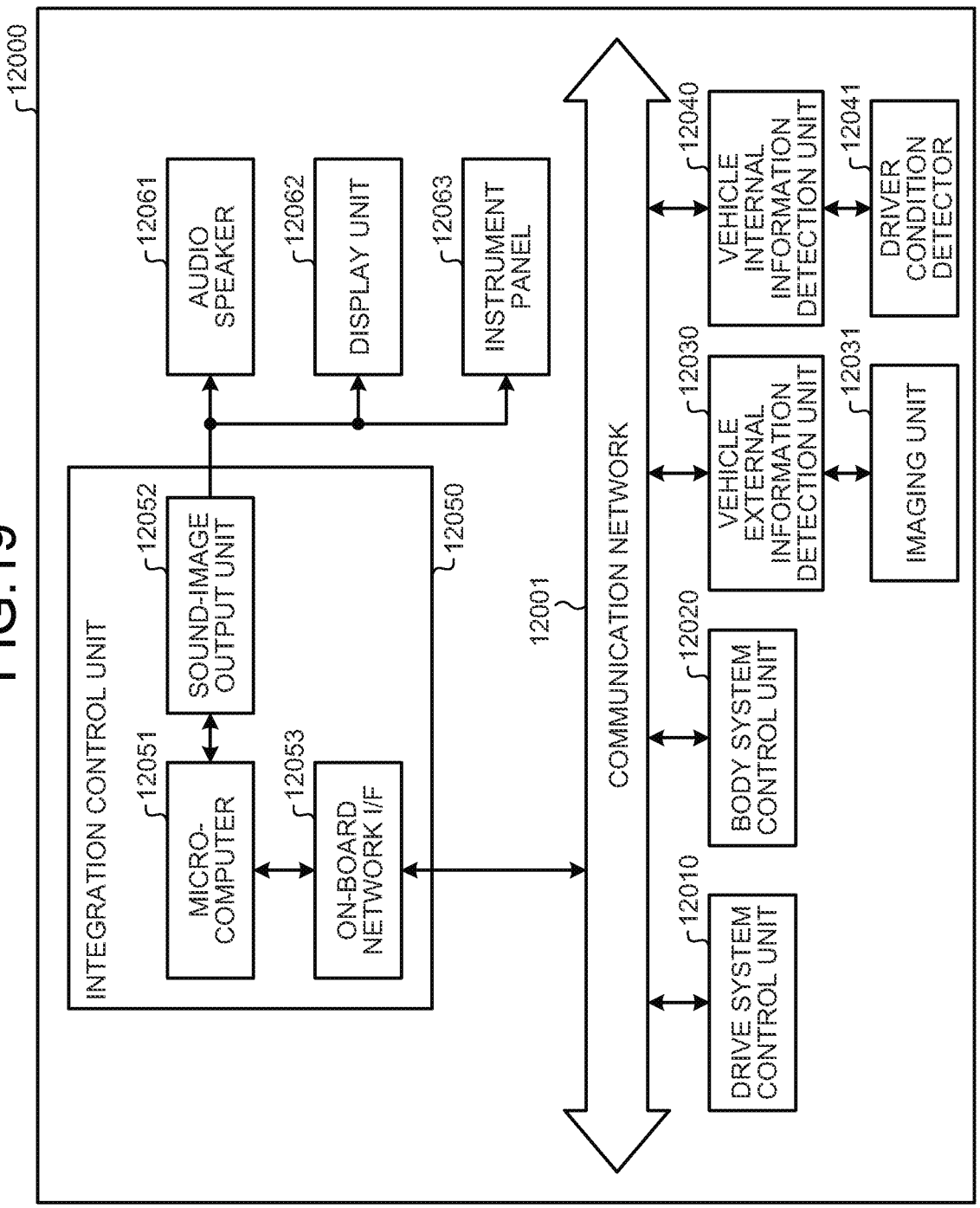
FIG. 19 is a block diagram illustrating an example of a schematic configuration of a vehicle control system that is an example of a mobile object control system to which the technique according to the disclosure is applicable.

FIG. 19 is a block diagram illustrating an example of a schematic configuration of a vehicle control system that is an example of a mobile object control system to which the technique according to the disclosure is applicable.

A vehicle control system 12000 includes a plurality of electronic control units that are connected via a communication network 12001. In the example illustrated in FIG. 19, the vehicle control system 12000 includes a drive system control unit 12010, a body system control unit 12020, a vehicle external information detection unit 12030, a vehicle internal information detection unit 12040, and an integration control unit 12050. As a functional configuration of the integration control unit 12050, a microcomputer 12051, a sound-image output unit 12052, and an on-board network I/F (interface) 12053 are illustrated.

The drive system control unit 12010 controls operations of devices that relate to a drive system of a vehicle according to various programs. For example, the drive system control unit 12010 functions as control devices, such as a drive force generation device like an engine or a drive motor, for generating a drive force of a vehicle, a drive force transmission mechanism for transmitting a drive force to wheels, a steering mechanism that adjusts the steering angle of a vehicle, and a braking device that generates a braking force of a vehicle.

The body system control unit 12020 controls operations of various devices that are installed in a vehicle body according to various programs. For example, the body system control unit 12020 functions as a keyless entry system, a smart-key system, a power window device, or a control device for various lumps, such as head lamps, rear lamps, brake lamps, turn signals and fog lamps. In this case, radio waves that are transmitted from a portable device substituting a key or signals of various switches can be input to the body system control unit 12020. The body system control unit 12020 receives inputs of those radio waves or signals and controls a door lock device, a power window device, lamps, etc.

The vehicle external information detection unit 12030 detects information on the outside of the vehicle on which the vehicle control system 12000 is installed. For example, an imaging unit 12031 is connected to the vehicle external information detection unit 12030. The vehicle external information detection unit 12030 causes the imaging unit 12031 to capture images of the outside of the vehicle and receives the captured images. The vehicle external information detection unit 12030 may performs a process of detecting an object, such as a human, a vehicle, an obstacle, a sign or characters on a road, or a distance detection process. The vehicle external information detection unit 12030, for example, performs image processing on a received image and performs an object detection process and a distance detection process based on the result of the image processing.

The imaging unit 12031 is an optical sensor that receives light and outputs an electric signal corresponding to the amount of the received light. The imaging unit 12031 is able to output the electric signal as an image or output the electric signal as information to measure a distance. The light that is received by the imaging unit 12031 may be a visible light or may be invisible light, such as infrared light.

The vehicle internal information detection unit 12040 detects information on the inside of the vehicle. For example, a driver condition detector 12041 that detects a condition of a driver is connected to the vehicle internal information detection unit 12040. The driver condition detector 12041, for example, includes a camera that captures an image of the driver and, based on detection information that is input from the driver condition detector 12041, the vehicle internal information detection unit 12040 may calculate a degree of tiredness or a degree of concentration of the driver or determine whether the driver is not drowsing.

The microcomputer 12051 is able to, based on the vehicle internal or external information that is acquired by the vehicle external information detection unit 12030 or the vehicle internal information detection unit 12040, computes a control target value of the drive force generation device, the steering mechanism, or the braking device and output a control instruction to the drive system control unit 12010. For example, the microcomputer 12051 is able to perform collaboration control aimed at implementation ADAS (Advanced Driver Assistance System) functions including avoiding or attenuating a crash of the vehicle, following traveling, traveling at a maintained vehicle speed, making an alert for a crash of the vehicle or making an alert for deviation of the vehicle from a lane.

By controlling the drive force generation device, the steering mechanism, the braking device, or the like, based on the information on the surroundings of the vehicle that is acquired by the vehicle external information detection unit 12030 or the vehicle internal information detection unit 12040, the microcomputer 12051 is able to perform collaboration control aimed at autonomous driving of autonomously traveling not depending on operations of the driver.

The microcomputer 12051 is able to output a control instruction to the body system control unit 12020 based on the vehicle external information that is acquired by the vehicle external information detection unit 12030. For example, the microcomputer 12051 is able to control the headlamps according to the position of a preceding vehicle or an oncoming vehicle that is detected by the vehicle external information detection unit 12030 and perform collaboration control aimed at preventing dazzling, such as switching a high beam to a low beam.

The sound-image output unit 12052 transmits an output signal of at least one of sound and an image to an output device capable of visually or auditorily notifying a person on the vehicle or the outside of the vehicle of information. In the example in FIG. 19, an audio speaker 12061, a display unit 12062, and an instrument panel 12063 are exemplified as the output device. The display unit 12062, for example, may include at least an on-board display or a headup display.

Figure 20:
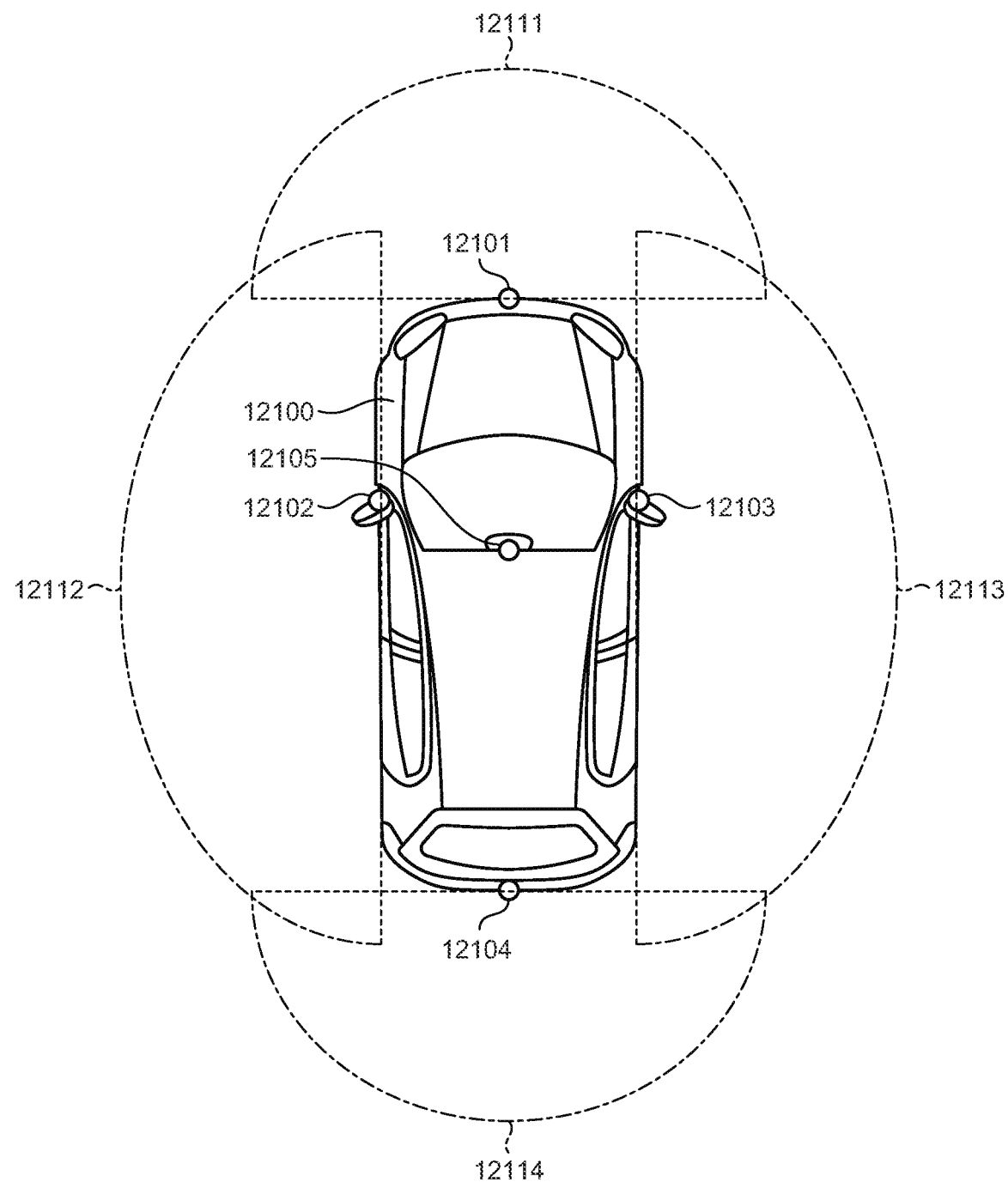
FIG. 20 is a diagram illustrating an example of positions in which imaging units are set.

FIG. 20 is a diagram illustrating an example of positions in which the imaging unit 12031 is set. A vehicle 12100 in FIG. 20 includes imaging units 12101, 12102, 12103, 12104 and 12105 as the imaging unit 12031.

The imaging units 12101, 12102, 12103, 12104 and 12105 are, for example, set in positions, such as a front nose, side-view mirrors, a rear bumper, a back door and an upper part of a windshield inside the vehicle. The imaging unit 12101 that the front nose has and the imaging unit 12105 that the upper part of the windshield inside the vehicle has mainly acquire images of the front view from the vehicle 12100. The imaging units 12102 and 12103 that the side-view mirrors have mainly acquire images of the side views from the vehicle 12100. The imaging unit 12104 that the rear bumper or the back door has acquires images of the back view from vehicle 12100. The images of the front views that are acquired by the imaging units 12101 and 12105 are mainly used to detect a preceding vehicle, a pedestrian, an obstacle, a traffic light, a traffic sign, a driving lane, or the like.

FIG. 20 illustrates an example of areas of imaging by the respective imaging units 12101 to 12104. An imaging area 12111 represents an area of imaging by the imaging unit 12101 that is arranged on the front nose, imaging areas 12112 and 12113 represent areas of imaging by the imaging units 12102 and 12103 that are arranged on the side-view mirrors, and an imaging area 12114 represents an area of imaging by the imaging unit 12104 that is arranged on the rear bumper or the back door. For example, superimposing sets of image data obtained by image capturing by the imaging units 12101 to 12104 makes it possible to obtain a bird's eye view image of the vehicle 12100 viewed from above.

At least one of the imaging units 12101 to 12104 may have a function of acquiring distance information. For example, at least one of the imaging units 12101 to 12104 may be a stereo camera consisting of multiple imaging elements or an imaging device with pixels for detecting a phase difference.

For example, the microcomputer 12051 calculates a distance to each three-dimensional object in the imaging areas 12111 to 12114 and a change in the distance over time (a relative speed with respect to the vehicle 12100) based on distance information that is acquired from the imaging units 12101 to 12104 and thus is able to extract, as a preceding vehicle, an object that is particularly closest on a path on which the vehicle 12100 travels and that travels at a given speed (for example, 0 km/h or higher) in a direction that is approximately the same as that of the vehicle 12100. The microcomputer 12051 is able to further set a distance between vehicles that should be kept in front of the preceding vehicle and perform automatic brake control (including following stop control), automatic acceleration control (including following start control), etc. As described above, it is possible to perform collaboration control aimed at autonomous driving of autonomously traveling not depending on operations of the driver.

For example, the microcomputer 12051 classifies three-dimensional object data on three-dimensional objects into two-wheels, passengers cars, large vehicles, pedestrians, utility poles, and other three-dimensional objects and extract the three-dimensional objects based on the distance information that is acquired from the imaging units 12101 to 12104 and the three-dimensional object data can be used for autonomously avoiding obstacles. For example, the microcomputer 12051 identifies obstacles around the vehicle 12100 as obstacles that are viewable by the driver of the vehicle 12100 and obstacles that are difficult to view. The microcomputer 12051 determines a crash risk indicating a risk of crash with each obstacle and is able to, when the crash risk is at or above a set value and a crash may occur, provide driving assist for preventing a crash by outputting an alert to the driver via the audio speaker 12061 or the display unit 12062 or performing compulsory deceleration or avoidance steering via the drive system control unit 12010.

At least one of the imaging units 12101 to 12104 may be an infrared camera that detects infrared rays. For example, the microcomputer 12051 is able to recognize a pedestrian by determining whether a pedestrian is present in images captured by the imaging units 12101 to 12104. The recognition of a pedestrian is performed according to a procedure to detect features in the images captured by the imaging units 12101 to 12104 serving as infrared cameras and a procedure to perform pattern matching on a series of features indicating an outline of an object and determine whether the object is a pedestrian. When the microcomputer 12051 determines that a pedestrian is resent in the images captured by the imaging units 12101 to 12104, the sound-image output unit 12052 controls the display unit 12062 to display a square outline for enhancement such that the square outline is superimposed on the recognized pedestrian. The sound-image output unit 12052 may control the display unit 12062 to display an icon representing a pedestrian, or the like, in a desired position.

An example of the vehicle control system to which the technique according to the disclosure is applicable has been described. The technique according to the disclosure is applicable to, for example, the imaging unit 12031 among the above-described configurations. Specifically, the ranging device 70 according to the above-described fifth embodiment of the disclosure is applicable to the imaging unit 12031. Applying the technique according to the disclosure to the imaging unit 12031 makes it possible to inhibit excessive application of laser light that is emitted from the ranging device 70 that measures a distance from a traveling vehicle to an oncoming vehicle or a pedestrian due to an overcurrent.

The effect described herein is an example only and does not put limitation and there may be another effect.

The technique may also employ the following configuration.

(1) A light source device comprising:
   a first resistor that is connected to a given potential;
   a light emitting element that is connected in series to the first resistor;
   a second resistor that is connected to the given potential; and
   a first current source that is connected in series to the second resistor and that is configured to supply a freely-selected current within a given range,
   wherein a first voltage is taken out from a first connection part where the first resistor and the light emitting element are connected to each other and a second voltage is taken out from a second connection part where the second resistor and the first current source are connected to each other.

(2) The light source device according to (1), wherein the light emitting element is configured as an element array on which a plurality of elements configured to emit light independently are arrayed, and
   the first current source supplies the freely-selected current corresponding in number to elements that are caused to emit light among the elements that are included in the element array.

(3) The light source device according to (2), wherein the first resistor has a resistance corresponding in number to the elements that are caused to emit light among the elements that are included in the element array.

(4) The light source device according to (2) or (3), further comprising a plurality of second current sources configured to independently supply a plurality of drive current that drive the respective elements to the elements, respectively, and including a first semiconductor chip on which the first resistor, the second resistor, the first current source and the second current sources are arranged, and a second semiconductor chip on which the element array is formed and that is superimposed onto the first semiconductor chip, wherein the elements contained in the element array that is arranged on the second semiconductor chip and the second current sources that are arranged on the first semiconductor chip have one-on-one connections.

(5) The light source device according to (4), wherein the second current sources are arranged on a given area on the first semiconductor chip, and the element array is arranged in a superimposed manner on an area corresponding to the given area on the first semiconductor chip.

(6) The light source device according to (4) or (5), wherein the first resistor includes a plurality of resistors that are connected in parallel and the resistors are divided into multiple blocks and are arranged on the first semiconductor chip.

(7) The light source device according to (6), wherein the first resistor is divided into two blocks that are arranged alignedly and the second resistor is arranged between the two blocks.

(8) The light source device according to (7), wherein the second resistor includes a plurality of resistors that are connected in parallel and the resistors are divided into multiple blocks and are arranged on the first semiconductor chip, and the blocks into which the resistors included in the first resistor are divided and the blocks into which the resistors included in the second resistor are divided are alternately and alignedly arranged on the first semiconductor chip.

(9) The light source device according to any one of (4) to (8), further comprising a capacitor that is arranged in a given area on the first semiconductor chip and that is connected to the first resistor, wherein the element array is arranged in a superimposed manner in the given area on the first semiconductor chip.

(10) The light source device according to any one of (1) to (9), further comprising:

a first step-down unit configured to take out, as the first voltage, a third voltage obtained by stepping down the voltage of the first connection part; and a second step-down unit configured to take out, as the second voltage, a fourth voltage obtained by stepping down the voltage of the second connection part.

(11) The light source device according to (10), wherein the first step-down unit and the second step-down unit are configured to take out the third voltage and the fourth voltage, respectively, by resistive voltage division.

(12) The light source device according to (10), wherein the first step-down unit and the second step-down unit are configured to take out the third voltage and the fourth voltage, respectively, by stepping down respective outputs of source followers using voltages of the first connection part and the second connection part as inputs, respectively.

(13) The light source device according to (12), wherein the second step-down unit is configured to further take out a voltage corresponding to the fourth voltage by resistive voltage division.

(14) The light source device according to (10), further comprising a third step-down unit configured to step down the given potential and take out a fifth voltage.

(15) The light source device according to any one of (1) to (14), further comprising a plurality of sets each including the second resistor and the first current source and the second voltage is taken out of each of the sets.

(16) The light source device according to any one of (1) to (15), further comprising a detector configured to detect a drive current for driving the light emitting element based on the first voltage, the second voltage, and the freely-selected current.

(17) The light source device according to (16), wherein the detector is configured to detect a resistance of the first resistor based on the second voltage and the freely-selected current and detect the drive current based on the resistance and the first voltage.

(18) The light source device according to (16) or (17), further comprising a controller configured to, based on the drive current that is detected by the detector, control an on state and an off state of at least the first resistor of the first resistor and the second resistor.

(19) The light source device according to any one of (1) to (18), wherein each of the first resistor and the second resistor is a resistor between a source and a drain of a MOS (Metal Oxide Semiconductor) transistor in an on state.

(20) An electronic device comprising:

a first resistor that is connected to a given potential;

a light emitting element that is connected in series to the first resistor;

a second resistor that is connected to the given potential; and a first current source that is connected in series to the second resistor and that is configured to supply a freely-selected current within a given range, a controller configured to generate a drive current that drives the light emitting element and performs drive control on the light emitting device; and a detector configured detect the drive current based on a first voltage that is taken out from a first connection part where the first resistor and the light emitting element are connected to each other, a second voltage that is taken out from a second connection part where the second resistor and the first current source are connected to each other, and the freely-selected current, wherein the controller is configured to determine whether an overcurrent is supplied to the light emitting element based on the drive current that is detected by the detector.

(21) The electronic device according to (20), wherein the light emitting element is configured as an element array on which a plurality of elements configured to emit light independently are arrayed, and the first current source supplies the given current corresponding in number to elements that are caused to emit light among the elements that are included in the element array.

(22) The electronic device according to (21), wherein the first resistor has a resistance corresponding in number to the elements that are caused to emit light among the elements that are included in the element array.

(23) The electronic device according to (21) or (22), further comprising a plurality of second current sources configured to independently supply a plurality of drive current that drive the respective elements to the elements, respectively, and including a first semiconductor chip on which the first resistor, the second resistor, the first current source and the second current sources are arranged, and a second semiconductor chip on which the element array is formed and that is superimposed onto the first semiconductor chip, wherein the elements contained in the element array that is arranged on the second semiconductor chip and the second current sources that are arranged on the first semiconductor chip have one-on-one connections.

(24) The electronic device according to (23), wherein the second current sources are arranged on a given area on the first semiconductor chip, and the element array is arranged in a superimposed manner on an area corresponding to the given area on the first semiconductor chip.

(25) The electronic device according to (23) or (24), wherein the first resistor includes a plurality of resistors that are connected in parallel and the resistors are divided into multiple blocks and are arranged on the first semiconductor chip.

(26) The electronic device according to (25), wherein the first resistor is divided into two blocks that are arranged alignedly and the second resistor is arranged between the two blocks.

(27) The electronic device according to (26), wherein the second resistor includes a plurality of resistors that are connected in parallel and the resistors are divided into multiple blocks and are arranged on the first semiconductor chip, and the blocks into which the resistors included in the first resistor are divided and the blocks into which the resistors included in the second resistor are divided are alternately and alignedly arranged on the first semiconductor chip.

(28) The electronic device according to any one of (23) to (27), further comprising a capacitor that is arranged in a given area on the first semiconductor chip and that is connected to the first resistor, wherein the element array is arranged in a superimposed manner in the given area on the first semiconductor chip.

(29) The electronic device according to any one of (20) to (28), further comprising:

a first step-down unit configured to take out, as the first voltage, a third voltage obtained by stepping down the voltage of the first connection part; and a second step-down unit configured to take out, as the second voltage, a fourth voltage obtained by stepping down the voltage of the second connection part.

(30) The electronic device according to (29), wherein the first step-down unit and the second step-down unit are configured to take out the third voltage and the fourth voltage, respectively, by resistive voltage division.

(31) The electronic device according to (29), wherein the first step-down unit and the second step-down unit are configured to take out the third voltage and the fourth voltage, respectively, by stepping down respective outputs of source followers using voltages of the first connection part and the second connection part as inputs, respectively.

(32) The electronic device according to (31), wherein the second step-down unit is configured to further take out a voltage corresponding to the fourth voltage by resistive voltage division.

(33) The electronic device according to (29), further comprising a third step-down unit configured to step down the given potential and take out a fifth voltage.

(34) The electronic device according to any one of (20) to (33), further comprising a plurality of sets each including the second resistor and the first current source and the second voltage is taken out of each of the sets.

(35) The electronic device according to any one of (20) to (34), further comprising a detector configured to detect a drive current for driving the light emitting element based on the first voltage, the second voltage, and the given current.

(36) The electronic device according to (35), wherein the detector is configured to detect a resistance of the first resistor based on the second voltage and the given current and detect the drive current based on the resistance and the first voltage.

(37) The electronic device according to (35) or (36), further comprising a controller configured to, based on the drive current that is detected by the detector, control an on state and an off state of at least the first resistor of the first resistor and the second resistor.

(38) The electronic device according to any one of (20) to (37), wherein each of the first resistor and the second resistor is a resistor between a source and a drain of a MOS (Metal Oxide Semiconductor) transistor in an on state.

REFERENCE SIGNS LIST

1 LIGHT SOURCE
10, 10a, 10b, 10c, 10d, 10e, 10f(a), 10f(b), 10f(b)', 10f(c), 200a, 200b DRIVER
11 CONTROLLER
12, $12_1$, $12_2$, $12_n$, $12_M$, $12_{M+1}$, $12_N$ LASER DIODE
42 DETECTION SIGNAL
51 RANGING UNIT
70 RANGING DEVICE
101, 101', $101_1$, $101_M$, $101_{M+1}$, $101_N$, 102, $102_1$, $102_M$, $102_{M+1}$, $102_N$, 203, 220, 221 TRANSISTOR
103, $103_1$, $103_2$, $103_n$, $103_M$, $103_{M+1}$, $103_N$, 104, $104_1$, $152_1$, $152_2$, 204, 205 CURRENT SOURCE
$131_1$, $131_2$, $132_1$, $132_2$, $151_1$, $151_2$, 153, 154, 155, 156 RESISTOR
140 CAPACITOR
302 LIGHT RECEIVER
1000 LDD CHIP
1001 PAD
1200a, 1200b, 1200c LD ARRAY

The invention claimed is:
1. A light source device, comprising:
a first resistor connected to a potential;
a light emitting element connected in series to the first resistor;
a second resistor connected to the potential;
a first current source connected in series to the second resistor, wherein the first current source is configured to supply a freely-selected current;
a first connection part where the first resistor is connected to the light emitting element, wherein the first connection part is configured to output a first voltage;
a second connection part where the second resistor is connected to the first current source, wherein the second connection part is configured to output a second voltage; and
a detector configured to detect a first drive current for the light emitting element, wherein the detection of the first drive current is based on the first voltage, the second voltage, and the freely-selected current.

2. The light source device according to claim 1, wherein
the light emitting element is configured as an element
array that includes a plurality of elements,
elements of the plurality of elements are configured to
emit light independently,
the first current source is further configured to supply the
freely-selected current corresponding in number to a set
of elements of the plurality of elements, and
the set of elements is controllable to emit light among the
plurality of elements in the element array.

3. The light source device according to claim 2, wherein
the first resistor has a resistance corresponding in number to
the set of elements.

4. The light source device according to claim 2, further
comprising:
a plurality of second current sources, wherein each second
current source of the plurality of second current sources
is configured to independently supply a second drive
current to drive a respective light emitting element of a
plurality of light emitting elements, wherein the element array includes the plurality of light emitting
elements;
a first semiconductor chip that includes the first resistor,
the second resistor, the first current source, and the
plurality of second current sources; and
a second semiconductor chip that includes the element
array, wherein the second semiconductor chip is superimposed onto the first semiconductor chip,
wherein the plurality of light emitting elements in the
element array on the second semiconductor chip and
the plurality of second current sources on the first
semiconductor chip have one-on-one connections.

5. The light source device according to claim 4, wherein
the first semiconductor chip includes a first area that
includes the plurality of second current sources,
the second semiconductor chip includes a second area
corresponding to the first area on the first semiconductor chip, and
the element array is superimposed on the second area.

6. The light source device according to claim 4, wherein
the first resistor includes a plurality of resistors connected
in parallel, and
the resistors of the plurality of resistors are divided into
multiple blocks on the first semiconductor chip.

7. The light source device according to claim 6, wherein
the resistors of the plurality of resistors are divided into
two blocks, and
the second resistor is between the two blocks.

8. The light source device according to claim 7, wherein
the second resistor includes a plurality of resistors connected in parallel,
the resistors of the plurality of resistors in the second
resistor are divided into multiple blocks on the first
semiconductor chip, and
the multiple blocks into which the plurality of resistors in
the first resistor are divided and the multiple blocks into
which the plurality of resistors in the second resistor are
divided are in an alternate arrangement on the first
semiconductor chip.

9. The light source device according to claim 4, further
comprising a capacitor in a specific area on the first semiconductor chip, wherein
the capacitor is connected to the first resistor, and
the element array is superimposed on the specific area on
the first semiconductor chip.

10. The light source device according to claim 1, further
comprising:
a first step-down unit configured to:
step down the first voltage of the first connection part
to obtain a third voltage; and
output the third voltage as the first voltage; and
a second step-down unit configured to:
step down the second voltage of the second connection
part to obtain a fourth voltage; and
output the fourth voltage as the second voltage.

11. The light source device according to claim 10, wherein
the first step-down unit and the second step-down unit are
configured to output the third voltage and the fourth voltage,
respectively, by resistive voltage division.

12. The light source device according to claim 10,
wherein
the first step-down unit is further configured to:
step down, based on the first voltage, an output of a first
source follower circuit to obtain the third voltage;
and
output the third voltage; and
the second step down unit is further configured to:
step down, based on the second voltage, an output of a
second source follower circuit to obtain the fourth
voltage; and
output the fourth voltage.

13. The light source device according to claim 12,
wherein the second step-down unit is further configured to
output a voltage corresponding to the fourth voltage by
resistive voltage division.

14. The light source device according to claim 10, further
comprising a third step-down unit configured to:
step down the potential to obtain a fifth voltage; and
output the fifth voltage.

15. The light source device according to claim 1, further
comprising a plurality of sets, wherein
each set of the plurality of sets includes the second resistor
and the first current source, and
each set of the plurality of sets is configured to output the
second voltage.

16. The light source device according to claim 1, wherein
the detector is further configured to:
detect a resistance of the first resistor based on the second
voltage and the freely-selected current; and
detect the drive current based on the detected resistance
and the first voltage.

17. The light source device according to claim 1, further
comprising a controller configured to, based on the detected
drive current, control an on state and an off state of at least
the first resistor of the first resistor and the second resistor.

18. The light source device according to claim 1, wherein
each of the first resistor and the second resistor is a resistor
between a source and a drain of a MOS (Metal Oxide
Semiconductor) transistor in an on state.

19. An electronic device, comprising:
a first resistor connected to a potential;
a light emitting element connected in series to the first
resistor;
a second resistor connected to the potential; and
a first current source connected in series to the second
resistor, wherein the first current source is configured to
supply a freely-selected current;

a controller configured to:
  generate a drive current; and
  execute drive control on the light emitting device based on the drive current; and
a detector configured detect the drive current based on:
  a first voltage output from a first connection part where the first resistor is connected to the light emitting element,
  a second voltage output from a second connection part where the second resistor is connected to the first current source, and
  the freely-selected current,
wherein the controller is further configured to determine whether an overcurrent is supplied to the light emitting element based on the detected drive current.

20. A light source device, comprising:
a first resistor connected to a potential;
a light emitting element connected in series to the first resistor, wherein
  the light emitting element is configured as an element array that includes a plurality of elements, and
  elements of the plurality of elements are configured to emit light independently;
a second resistor connected to the potential;
a first current source connected in series to the second resistor, wherein
  the first current source is configured to supply a freely-selected current corresponding in number to a set of elements of the plurality of elements, and the set of elements is controlled to emit light among the plurality of elements in the element array;
a first connection part where the first resistor is connected to the light emitting element, wherein the first connection part is configured to output a first voltage; and
a second connection part where the second resistor is connected to the first current source, wherein the second connection part is configured to output a second voltage.

21. A light source device, comprising:
a first resistor connected to a potential;
a light emitting element connected in series to the first resistor;
a second resistor connected to the potential;
a first current source connected in series to the second resistor, wherein the first current source is configured to supply a freely-selected current;
a first connection part where the first resistor is connected to the light emitting element, wherein the first connection part is configured to output a first voltage;
a second connection part where the second resistor is connected to the first current source, wherein the second connection part is configured to output a second voltage; and
a plurality of sets, wherein
  each set of the plurality of sets includes the second resistor and the first current source, and
  each set of the plurality of sets is configured to output the second voltage.

* * * * *